(12) United States Patent
Vles et al.

(10) Patent No.: US 12,117,726 B2
(45) Date of Patent: Oct. 15, 2024

(54) PELLICLE AND PELLICLE ASSEMBLY

(71) Applicant: ASML NETHERLANDS B.V., Veldhoven (NL)

(72) Inventors: David Ferdinand Vles, Eindhoven (NL); Chaitanya Krishna Ande, Eindhoven (NL); Antonius Franciscus Johannes De Groot, Someren (NL); Adrianus Johannes Maria Giesbers, Vlijmen (NL); Johannes Joseph Janssen, Beesel (NL); Paul Janssen, Eindhoven (NL); Johan Hendrik Klootwijk, Eindhoven (NL); Peter Simon Antonius Knapen, Deurne (NL); Evgenia Kurganova, Nijmegen (NL); Marcel Peter Meijer, Eindhoven (NL); Wouter Rogier Meijerink, Eindhoven (NL); Maxim Aleksandrovich Nasalevich, Eindhoven (NL); Arnoud Willem Notenboom, Rosmalen (NL); Raymond Olsman, Bennekom (NL); Hrishikesh Patel, Eindhoven (NL); Mária Péter, Eindhoven (NL); Gerrit van den Bosch, Geldermalsen (NL); Wilhelmus Theodorus Anthonius Johannes van den Einden, Deurne (NL); Willem Joan Van Der Zande, Bussum (NL); Pieter-Jan Van Zwol, Eindhoven (NL); Johannes Petrus Martinus Bernardus Vermeulen, Leende (NL); Willem-Pieter Voorthuijzen, 's-Hertogenbosch (NL); Hendrikus Jan Wondergem, Veldhoven (NL); Aleksandar Nikolov Zdravkov, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/220,799

(22) Filed: Jul. 11, 2023

(65) Prior Publication Data
US 2024/0027893 A1    Jan. 25, 2024

Related U.S. Application Data

(63) Continuation of application No. 17/548,944, filed on Dec. 13, 2021, now Pat. No. 11,754,918, which is a continuation of application No. 16/614,815, filed as application No. PCT/EP2018/065127 on Jun. 8, 2018, now Pat. No. 11,231,646.

(30) Foreign Application Priority Data

Jun. 15, 2017  (EP) .................................. 17176205
Sep. 12, 2017  (EP) .................................. 17190503

(51) Int. Cl.
G03F 1/64    (2012.01)

(52) U.S. Cl.
CPC ...................................... G03F 1/64 (2013.01)

(58) Field of Classification Search
CPC ........................................................ G03F 1/64
USPC ............................................................ 430/5
See application file for complete search history.

(56) References Cited

U.S. PATENT DOCUMENTS

| 5,763,121 | A  | 6/1998  | Randall |
| 7,190,438 | B2 | 3/2007  | Yamaguchi et al. |
| 7,209,220 | B2 | 4/2007  | del Puerto et al. |
| 9,658,526 | B2 | 5/2017  | Lin et al. |
| 10,139,725 | B2 | 11/2018 | Wiley et al. |
| 10,481,510 | B2 | 11/2019 | Yakunin et al. |
| 11,287,737 | B2 | 3/2022  | Van Zwol et al. |
| 2002/0102015 | A1 | 8/2002 | Hunatsu |
| 2003/0004076 | A1 | 1/2003 | Barrington et al. |
| 2005/0025959 | A1 | 2/2005 | Bellman |
| 2006/0033053 | A1 | 2/2006 | Lee et al. |
| 2006/0146313 | A1 | 7/2006 | Gallagher et al. |
| 2006/0281014 | A1 | 12/2006 | Loos et al. |
| 2008/0100818 | A1 | 5/2008 | Onvlee et al. |
| 2009/0246644 | A1 | 10/2009 | Chakravorty et al. |
| 2013/0010277 | A1 | 1/2013 | del Puerto et al. |
| 2015/0160569 | A1 | 6/2015 | Osorio Oliveros |
| 2015/0277230 | A1 | 10/2015 | Mueller et al. |
| 2016/0033860 | A1 | 2/2016 | Wiley et al. |
| 2016/0313637 | A1 | 10/2016 | Jansen et al. |

(Continued)

FOREIGN PATENT DOCUMENTS

| CN | 203012349 | 6/2013 |
| CN | 105025861 | 11/2015 |

(Continued)

OTHER PUBLICATIONS

International Search Report and Written Opinion issued in corresponding PCT Patent Application No. PCT/EP2018/065127, dated Jan. 4, 2019.

(Continued)

*Primary Examiner* — Christopher G Young
(74) *Attorney, Agent, or Firm* — Pillsbury Winthrop Shaw Pittman, LLP

(57) ABSTRACT

A pellicle assembly includes a pellicle frame defining a surface onto which a pellicle is, or to be, attached. The pellicle assembly includes one or more three-dimensional expansion structures that allow the pellicle to expand under stress. A pellicle assembly for a patterning device, the pellicle assembly includes one or more actuators for moving the pellicle assembly towards and way from the patterning device.

20 Claims, 15 Drawing Sheets

(56) References Cited

U.S. PATENT DOCUMENTS

| | | | |
|---|---|---|---|
| 2017/0038676 A1 | 2/2017 | Jung et al. | |
| 2017/0082920 A1 | 3/2017 | Tseng et al. | |

FOREIGN PATENT DOCUMENTS

| | | |
|---|---|---|
| CN | 103080840 | 1/2016 |
| EP | 1429186 | 6/2004 |
| EP | 3079014 | 10/2016 |
| JP | H11160855 | 6/1999 |
| JP | H11202476 | 7/1999 |
| JP | 2000194122 | 7/2000 |
| JP | 2005309129 | 11/2005 |
| JP | 2010541267 | 12/2010 |
| JP | 2015036791 | 2/2015 |
| JP | 2016200616 | 12/2016 |
| JP | 2016539372 | 12/2016 |
| KR | 20150136523 | 12/2015 |
| KR | 10-2016-0087927 | 7/2016 |
| KR | 20170029556 | 3/2017 |
| TW | I357096 | 1/2012 |
| TW | 201642019 | 12/2016 |
| WO | 0246842 | 6/2002 |
| WO | 2011160861 | 12/2011 |
| WO | 2013152921 | 10/2013 |
| WO | 2014188710 | 11/2014 |
| WO | 2016001351 | 1/2016 |
| WO | 2016079051 | 5/2016 |
| WO | 2017012846 | 1/2017 |
| WO | 2017/067813 | 4/2017 |

OTHER PUBLICATIONS

Search Report and Written Opinion issued in corresponding Netherlands Patent Application No. NL 2022760, dated Sep. 10, 2019.
Search Report and Written Opinion issued in corresponding Netherlands Patent Application No. NL 2021084, dated Dec. 7, 2018.
Netherlands Search Report issued in corresponding Netherlands Patent Application No. 2024717, dated Sep. 15, 2020.
Netherlands Search Report issued in corresponding Netherlands Patent Application No. 2024716, dated Sep. 15, 2020.
Office Action issued in corresponding Chinese Patent Application No. 201880040335.2, dated Feb. 15, 2023.
Taiwanese Office Action issued in corresponding Taiwanese Patent Application No. 107120527, dated Jun. 6, 2022.
Japanese Office Action issued in corresponding Japanese Patent Application No. 2019-563039, dated Mar. 31, 2022.
Office Action issued in corresponding Korean Patent Application No. 10-2022-7041100, dated Jan. 12, 2024.

PELLICLE AND PELLICLE ASSEMBLY

This application is a continuation of U.S. patent application Ser. No. 17/548,944 which was filed on Dec. 13, 2021, now allowed, which is a continuation of U.S. patent application Ser. No. 16/614,815 which was filed on Nov. 19, 2019, now U.S. Pat. No. 11,231,646, which is a U.S. national phase entry of PCT/EP2018/065127 which was filed Jun. 8, 2018, which claims the benefit of priority of European Patent Application No. 17176205.7, which was filed on Jun. 15, 2017 and of European Patent Application No. 17190503.7, filed on Sep. 12, 2017, each of the foregoing applications is incorporated herein in its entirety by reference.

FIELD

The present disclosure relates to a pellicle and a pellicle assembly. A pellicle assembly may comprise a pellicle and a frame for supporting the pellicle. A pellicle may be suitable for use with a patterning device for a lithographic apparatus. The present disclosure has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A pattern may be imparted to a radiation beam in a lithographic apparatus using a patterning device. A patterning device may be protected from particle contamination by a pellicle. The pellicle may be supported by a pellicle frame.

The use of pellicles in lithography is well-known and well-established. A typical pellicle in a DUV lithographic apparatus is a membrane which is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

It may be desirable to use a pellicle in an EUV lithographic apparatus. EUV lithography differs from DUV lithography in that it is typically performed in a vacuum and the patterning device is typically reflective rather than being transmissive.

It is desirable to provide a pellicle and/or a pellicle assembly which overcomes or mitigates one or more problems associated with the prior art. Embodiments of the invention which are described herein may have use in an EUV lithographic apparatus. Embodiments of the invention may also have use in a DUV lithographic apparatus or another form of lithographic apparatus.

SUMMARY

According to an aspect described herein, there is provided a pellicle assembly. The pellicle assembly comprises a pellicle frame defining a surface onto which a pellicle is attached. The pellicle assembly further comprises one or more three-dimensional expansion structures that allow the pellicle to expand under stress.

In this way, the lifetime and the reliability of the pellicle assembly may be increased.

At least one of the three-dimensional expansion structures may be formed within the pellicle frame and thereby imparted to the pellicle. For example, by forming the three-dimensional expansion structures within the pellicle frame and depositing the pellicle atop the pellicle frame, the three-dimensional expansion structures may also be imparted to the pellicle.

At least one of the three-dimensional expansion structures may form a spring. For example, a spring may comprise at least one V-shape formation formed within the pellicle frame. The at least one structure may comprise a plurality of springs formed within the pellicle frame and positioned around a central portion of the pellicle. The central portion of the pellicle is a portion of the pellicle that is not in direct contact with the frame. In this way, control of the stress within the pellicle may be more accurately controlled. The at least one spring may be a leaf-spring.

At least one of the three-dimensional expansion structures may be present on the central portion of the pellicle.

The frame may comprise a substrate and the pellicle assembly may comprise at least one spring layer between the substrate and the pellicle. At least one spring may be formed within the spring layer. The addition of a spring layer further increases the ability to select a desired stress within the pellicle.

At least one three-dimensional expansion structure may comprise a herringbone pattern. The herringbone pattern may extend across an entire pellicle or on an outer (e.g., non-image field) portion of a pellicle.

The at least one three-dimensional expansion structure may result in roughness across a surface of the pellicle.

According to an aspect described herein, there is provided a pellicle assembly comprising a pellicle frame defining a surface onto which a pellicle is attached. The surface comprises at least one adhesive boundary for reducing adhesive spread. The provision of an adhesive boundary reduces the tendency for adhesive to spread and therefore reduces contamination of the space between a patterning device and the pellicle.

The at least one adhesive boundary may comprise a circular boundary. Additionally or alternatively, the at least one adhesive boundary may comprise a line boundary. By providing a circular boundary, the adhesive may be applied within the circular boundary, causing the adhesive to spread and center within the circular boundary but reducing an amount of adhesive that extends beyond the circular boundary. In this way, the accuracy with which adhesive may be applied is beneficially increased.

The line boundary may be positioned adjacent an edge of the pellicle frame, the edge of the frame adjacent a central portion of the pellicle, where the central portion of the pellicle is a portion of the pellicle that is not in direct contact with the pellicle frame.

The line boundary may be positioned between the circular boundary and a central portion of the pellicle.

The at least one boundary may comprise a groove within the frame.

The pellicle assembly may comprise adhesive that is substantially concentric with the circular boundary.

According to an aspect described herein, there is provided a pellicle assembly comprising a pellicle frame, a pellicle, and one or more actuators for moving the pellicle assembly towards and way from a patterning device. In this way, the space between the pellicle and a patterning device may be opened and closed to allow processing of that space. For example, when open, the space may be flushed, while when closed, the space may be sealed and pressure controlled.

The actuators may be configured to transition the pellicle assembly between a closed configuration in which a substantially sealed volume is formed between the pellicle and a patterning device and an open configuration in which a volume between the pellicle and the patterning device is in fluid communication with an ambient environment.

According to an aspect described herein, there is provided a pellicle assembly comprising a pellicle frame defining a surface onto which the pellicle is attached. The pellicle frame comprises a first material having a first coefficient of thermal expansion (CTE) and a second material having a second coefficient of thermal expansion. In this way, the overall CTE of the pellicle frame may be adjusted and selected so as to reduce (or increase) a difference over the CTE of the pellicle. The difference in CTE between the pellicle and the pellicle frame results in stress within the pellicle after processing (such as annealing) during manufacture. By controlling the overall CTE of the pellicle frame, the amount of stress within the pellicle may be controlled.

The first material may comprise silicon. The first material may comprise a plurality of perforations and the second material is located within the plurality of perforations. In other embodiments, the first material may comprise one or more channels, and the second material may be provided within the one or more channels.

The second material may at least partially surround the first material.

The second material may comprise a metal. For example, the second material may comprise aluminum and/or molybdenum.

According to an aspect described herein, there is provide a pellicle assembly comprising a pellicle frame defining a surface onto which the pellicle is attached, wherein the pellicle frame is bonded to the pellicle. The pellicle may be an annealed pellicle and the frame may be bonded to the pellicle after such annealing.

The pellicle frame may comprise a material having a coefficient of thermal expansion (CTE) which is lower than the CTE of silicon. For example, the pellicle frame may comprise a glass-ceramic material such as ZERODUR® ceramic material.

The pellicle frame may have been bonded to the pellicle using a bonding procedure operating at a temperature of less than approximately 160 degrees Celsius. In this way, a pellicle frame comprising silicon may be used, while achieving a non-operational stress (i.e. pre-stress) within the pellicle of approximately 200 MPa. The pellicle frame may have been bonded to the pellicle using at least one of optical contact bonding, hydrogen bonding, gold diffusion bonding or anodic bonding. It will be appreciated that any other bonding method may be used, where a particular bonding method operates at a temperature which gives rise to a desired pre-stress within the pellicle after manufacture. By way of example only, other examples of bonding include, mechanical (e.g. bolts, fasteners, etc.), ceramic green body bonding (in which two pieces of a ceramic material which are in the green state are bonded together and change into a monolithic part during sintering and for which another common term is co-fire bonding), direct bonding, glass bonding, atomic diffusion bonding, and laser ablation assisted bonding.

The pellicle frame may be formed in a single piece. That is, the pellicle frame may be such that it does not comprise a plurality of pieces which have been connected (e.g. via an adhesive or mechanical retaining means) so as to form a whole. In this way, a number of interfaces between components of the pellicle assembly is reduced, thereby reducing particulate contamination.

The pellicle frame may comprise an inert coating to reduce outgassing.

The pellicle of any of the above aspects may comprise molybdenum disilicide ($MoSi_2$). A stress within the pellicle may be in a range of from 100 MPa to 250 MPa, for example approximately 200 MPa at room temperature.

The pellicle may comprise a graphite-based material. A stress within the pellicle may be in a range of from 300 MPa to 450 MPa, for example approximately 400 MPa at room temperature.

According to an aspect described herein, there is provided a lithographic apparatus arranged to project a pattern from a patterning device onto a substrate. A pellicle according to any preceding aspects is positioned in the vicinity of the patterning device to prevent particles from contacting the patterning device.

According to an aspect described herein, there is provided a method of manufacturing a pellicle assembly. The method comprises depositing a pellicle onto a substrate, bonding a pellicle frame to the pellicle such that the pellicle is between the pellicle frame and the substrate, etching the substrate to leave the pellicle and the pellicle frame.

The pellicle frame may be bonded to the pellicle at a temperature below 160 degrees Celsius.

The method may further comprise annealing the pellicle after depositing the pellicle onto a substrate and before bonding a pellicle frame to the pellicle.

According to an aspect described herein, there is provided a pellicle assembly, comprising a pellicle frame defining a surface onto which a pellicle is attached, wherein a computer readable and writeable tracking device is provided on or in the pellicle frame.

The tracking device may be configured to store a unique identifier of the pellicle and/or the pellicle assembly.

The tracking device may be configured to store operational data indicating usage history of the pellicle and/or information specific for that pellicle such as parameters measured offline (e.g. transmission, reflectivity, etc.).

According to an aspect described herein, there is provided a lithographic apparatus arranged to project a pattern from a patterning device onto a substrate, comprising a controller comprising a processor configured to execute computer readable instructions to cause a transceiver arrangement to read from and write to a tracking device of a pellicle assembly according to the eighth aspect.

The computer readable instructions may be configured to cause the processor to obtain one or more operational data items from the tracking device and to determine whether the one or more operational data items exceed a threshold.

The computer readable instructions may be configured to cause the processor, in response to determining that the one or more operational data items exceed a threshold, to cause the lithographic apparatus to unload the pellicle assembly.

The computer readable instructions may be configured to cause the processor to cause the transceiver arrangement to write to the tracking device data indicating that the pellicle assembly has been unloaded.

The computer readable instructions may be configured to cause the processor, in response to determining that the one or more operational data items do not exceed the threshold, to cause the transceiver to record operational data on the tracking device during use of the lithographic apparatus.

According to an aspect described herein, there is provided a pellicle assembly, the pellicle assembly comprising a pellicle frame defining a surface onto which a pellicle is attached, wherein the pellicle is configured to, in use, exhibit one or more wrinkles, wherein the one or more wrinkles are configured to reflect a portion of an incident radiation beam away from a substrate.

The pellicle may be configured such that the wrinkles create a maximum angle of greater than 35 mrad to a plane defined by the surface of the patterning device.

The pellicle may be configured such that the wrinkles create a maximum angle of less than 300 mrad to a plane defined by the surface of the patterning device.

The pellicle may be configured to reflect approximately 0.4% of an incident radiation beam during use.

According to an aspect described herein, there is provided a pellicle assembly, comprising a pellicle frame defining a surface onto which a pellicle is attached and one or more tensile layers provided on a surface of the pellicle and extending inwardly beyond an inner edge of the pellicle frame. The one or more tensile layers act to both strengthen the pellicle assembly and to maintain tension in the pellicle.

At least one of the one or more tensile layers may be provided on a top side of the pellicle such that the pellicle is positioned between the tensile layer and the frame. At least one of the one or more tensile layers may be provided on an underside of the pellicle. The one or more tensile layers may comprises a first tensile layer provided on a top side of the pellicle and a second tensile layer provided on an underside of the pellicle.

At least one of the one or more tensile layers comprises a first portion extending inwardly from the inner edge of the pellicle frame and a second portion extending outwardly from the inner edge of the pellicle frame, wherein the second portion is longer than the first portion. In this way, a majority of the tensile layer may be in communication with (either directly or through the pellicle) the pellicle frame, thereby further strengthening the pellicle assembly.

At least one of the one or more tensile layers may comprise a multi-layer structure.

According to an aspect described herein, there is provided a lithographic apparatus arranged to project a pattern from a patterning device onto a substrate, comprising a pellicle assembly according to the eleventh aspect.

According to an aspect described herein, there is provided a dynamic gas lock for a lithographic apparatus, comprising a pellicle assembly according to any one of the pellicle assemblies set out above.

It will be appreciated that features described in connection with one or more of the aspects described above may be utilized in combination with other aspects.

BRIEF DESCRIPTION OF THE DRAWINGS

Embodiments of the invention will now be described, by way of example only, with reference to the accompanying schematic drawings, in which.

DETAILED DESCRIPTION

Figure 1:
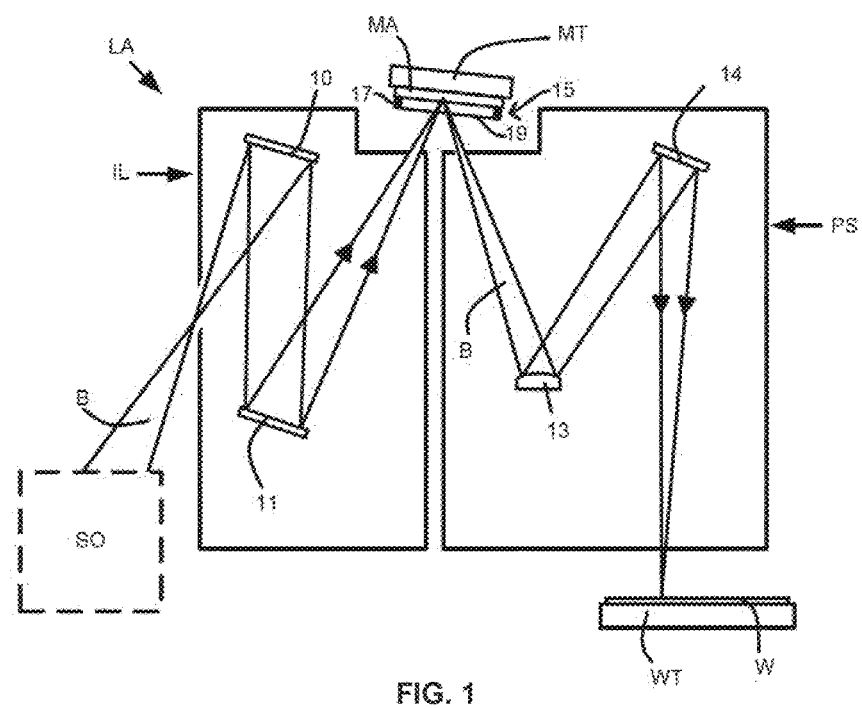
FIG. 1 schematically depicts a lithographic system comprising a lithographic apparatus including a pellicle assembly.

FIG. 1 shows a lithographic system including a pellicle assembly 15 according to one embodiment described herein. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO may take any form, and may be for example a type which may be referred to as a laser produced plasma (LPP) source. In an alternative example, the radiation source SO may comprise one or more free electron lasers. The one or more free electron lasers may be configured to emit EUV radiation that may be provided to one or more lithographic apparatus.

The radiation beam B passes from the radiation source SO into the illumination system IL, which is configured to condition the radiation beam. The illumination system IL may include a faceted field mirror device 10 and a faceted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA is protected by a pellicle 19, which is held in place by a pellicle frame 17. The pellicle 19 and the pellicle frame 17 together form the pellicle assembly 15. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W. Although the projection system PS has two mirrors in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

As was described briefly above, the pellicle assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). The pellicle 19 acts to protect the patterning device MA from particle contamination. The pellicle 19 may be herein referred to as an EUV transparent pellicle.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and therefore the pattern that is transferred to the substrate W. The pellicle 19 provides a barrier between the patterning device MA and the environment in the lithographic apparatus LA in order to prevent particles from being deposited on the patterning device MA.

In use, the pellicle 19 is positioned at a distance from the patterning device MA that is sufficient that any particles that are incident upon the surface of the pellicle 19 are not in the focal plane of the radiation beam B. This separation between the pellicle 19 and the patterning device MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some embodiments, the separation between the pellicle 19 and the patterning device MA may, for example, be between 2 mm and 3 mm (e.g. around 2.5 mm). In some embodiments, as described in more detail below, a separation between the pellicle 19 and the patterning device may be adjustable.

Figure 2:
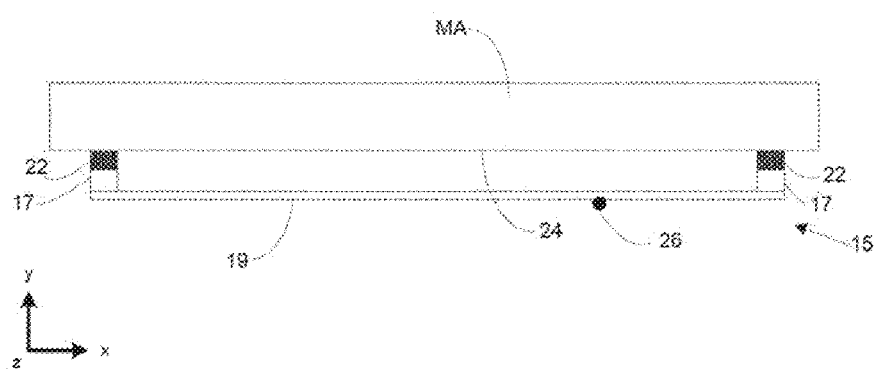
FIG. 2 schematically depicts a pellicle assembly.
Figure 12:
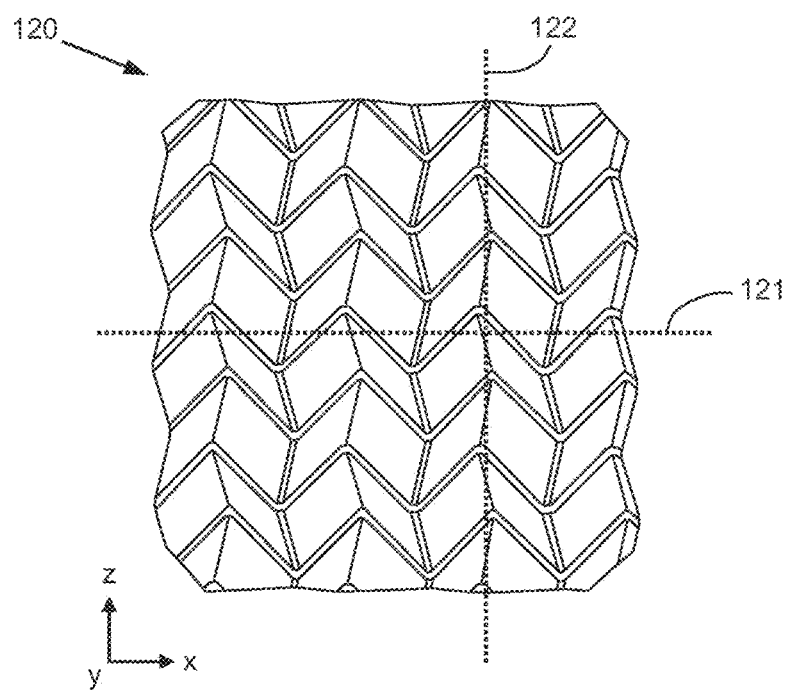
FIG. 12 schematically depicts a pellicle having herringbone expansion structures.

FIG. 2 is a schematic illustration of the pellicle assembly 15 and the patterning device MA in cross-section and in more detail. The patterning device MA has a patterned surface 24. The pellicle frame 17 supports the pellicle 19 around a perimeter portion of the pellicle 19. The pellicle frame 17 may include an attachment mechanism 22 configured to allow the pellicle frame to be removably attachable to the patterning device MA (i.e. to allow the pellicle frame to be attachable to and detachable from the patterning device MA). The attachment mechanism 22 is configured to engage with an attachment feature (not shown) provided on the patterning device MA. The attachment feature may, for example, be a protrusion which extends from the patterning device MA. The attachment mechanism 22 may, for example, comprise a locking member which engages with the protrusion and secures the pellicle frame 17 to the patterning device MA. It is noted that while referred to as a pellicle frame herein, the pellicle frame 17 may be referred to elsewhere as a pellicle border. Additionally, the pellicle frame 17 (or "border") may be attached to the mask via a further pellicle frame. For example, with reference to FIG. 4B of Patent Application No. WO 2016079051 A2, there is shown an arrangement comprising a pellicle membrane 19, a border portion (which may, in some arrangements, correspond to the general, but not the specific, component at the position of the "frame 17" of the present application) and an additional frame 17 to be attached to the patterning device MA via attachment mechanisms as shown in FIGS. 12 and 31 of WO 2016079051. A plurality of attachment mechanisms and associated attachment features may be provided. The attachment mechanisms may be distributed around the pellicle frame 17 (e.g. two on one side of the frame and two on an opposite side of the frame). Associated attachment features may be distributed around the perimeter of the patterning device MA.

A contamination particle 26 is schematically shown in FIG. 2. The contamination particle 26 was incident upon the pellicle 19 and is held by the pellicle 19. The pellicle 19 holds the contamination particle sufficiently far from the patterned surface 24 of the mask MA that it is not imaged onto substrates by the lithographic apparatus LA.

A pellicle assembly according to an embodiment of the invention may allow a mask pattern (on the patterning device) to be provided which remains substantially defect free during use (the mask pattern is protected from contamination by the pellicle).

The pellicle assembly 15 may be constructed by depositing the pellicle 19 (which may be made of, for example polysilicon (pSi)) directly on top of a substrate which is to provide the frame 17. The substrate may be, for example, a silicon wafer. After depositing of the film of the pellicle 19, the substrate may be selectively back-etched to remove a central portion of the substrate and leave only an outer perimeter to form the frame 17 to support the pellicle 19. The pellicle 19 may have a thickness which is, for example, of the order of 15 to 50 nm.

The pellicle 19 requires a level of "pre-stress" (i.e. a level of stress which is present within the pellicle 19 when not in use and therefore not subject to radiation and gas pressure during a scanning operation). The pre-stress within the pellicle 19 allows the pellicle 19 to withstand pressure differences brought about by changes in temperature and gas pressure during scanning operations. However, where the pre-stress is too large, this will reduce the overall lifetime of the pellicle assembly 15. As such, it is desired to give the pellicle 19 a minimum pre-stress (in the depicted x-y plane) in order to limit the deflection (in the y direction) at a given pressure on the pellicle 19. When deflection of the pellicle 19 is too large in the y direction, the pellicle 19 might break and/or touch other components in the surrounding area of the pellicle 19.

The pre-stress of the pellicle 19 is preferably limited since the stress of the pellicle 19 is preferably significantly below the ultimate tensile stress or yield strength of the material from which the pellicle 19 is formed. The margin between pre-stress and the ultimate tensile stress should be as large as possible to increase the lifetime and reliability of the pellicle 19.

Pre-stress may be incorporated in the pellicle 19 through one or more mechanisms including stoichiometry, hydrogenation, control of crystal size, doping and selective mismatch of the coefficient of thermal expansion (CTE) during depositing of the pellicle 19 onto the wafer 17. The pellicle 19 may also comprise multiple layers (e.g., capping layers to protect the pellicle 19 from, for example, hydrogen radicals). Due to CTE mismatches between layers of the pellicle 19 parts of the pellicle assembly 15 and the process of heteroepitaxy by which the different layers of the pellicle 19 may be deposited, the stresses in each layer of a multi-layer pellicle 19 may be different.

The use of stoichiometry, hydrogenation, crystal size selection (i.e. number of grain boundaries), doping and others can all impact the chemical stability of the layers of the pellicle 19. Generally, while the process used to manufacture a pellicle 19 may result in a desired pre-stress (where the desired pre-stress is relatively high), use of the above outlined techniques are such that the pellicle 19 may not have the most stable configuration from a thermo-chemical perspective. For example, a pellicle constructed from molybdenum disilicide ($MoSi_2$) oxidizes exponentially faster as a function of pre-stress. Moreover, it is generally difficult to obtain a pre-stress below a value of 600 MPa in a complementary metal-oxide-semiconductor (CMOS) based manufacturing process using the methods outlined above. In some embodiments, it is desirable to obtain a pellicle 19 with a pre-stress of the order of approximately 100-200 MPa.

Additionally, the pellicle frame 17 is generally inflexible compared to the pellicle 19, resulting in internal stresses in addition to the desired pre-stress. As such, a pre-stress of e.g. 100 MPa within the pellicle 19, may be in reality a pre-stress of 100 MPa±a deviation caused by the pellicle frame 15. In other words, some parts of the pellicle 19 may be under a higher stress than others, resulting in points of greater mechanical weakness in the pellicle 19.

An average pre-stress within a pellicle 19 is generally the same in both the depicted x- and y-dimensions. In an embodiment, it is desired to prevent wrinkles with high (of the order of 300 mrad) angles (between the x-y plane and z-dimension). One way to reduce local wrinkles with high angles is by reducing the pre-stress in the scanning (x) direction. The stress in scanning (x) direction only need be a small amount larger than the Poisson ratio ν (approximately 0.17-0.25 for $MoSi_2$) multiplied by the stress in y-direction σy to prevent buckling during rest—i.e.:

$$\sigma_x = \nu^* \sigma_y.$$

During exposure, the stress in the non-scanning (y) direction σy will decline approximately ten times faster than the stress in the scanning (x) direction σx. However, because $\sigma_x$ will be much lower than $\nu^*\sigma_y$, the buckle modes that can occur on the pellicle 19 within the exposure slit will be of a lower order, hence the chances of local high wrinkle angles are also lower. The lowest order buckle mode is one period of a sine, i.e. a single wrinkle. It takes energy to pull the pellicle 19 into a higher order buckle mode (i.e. such that the pellicle 19 contains multiple wrinkles). The more energy that is present, the higher the chance that locally, due to e.g. an imperfection in the pellicle 192, the pellicle 192 will be pulled into a high angle (locally). As such, in embodiments, using techniques described herein, the amount of pre-stress in the scanning direction may be reduced.

It is desirable to decouple the internal microstructure of the pellicle 19 from the pre-stress within the pellicle 19. That is, it is beneficial to control the pre-stress in the pellicle 19 mechanically (or extrinsically), not through the intrinsic microstructure of the pellicle 19. This allows the pellicle 19 to be manufactured so as to be as chemically inert as possible, while still allowing for tuning of the pre-stress within the pellicle 19 to a desired level.

Figure 3A:
FIGS. 3a, 3b and 3c schematically depict stages of construction of a pellicle assembly having expansion structures to allow expansion of a pellicle under stress.
Figure 3B:
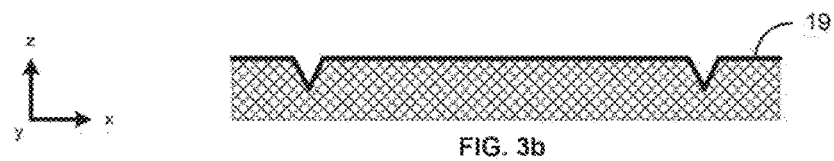
Figure 3C:
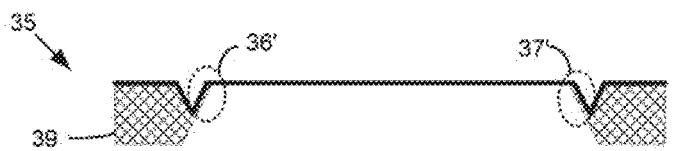

FIG. 3 schematically illustrates stages of manufacture of a pellicle assembly in accordance with an embodiment. The pellicle assembly 35 is manufactured by etching two notches 36, 37 into a substrate 38 (e.g., a silicon wafer) that will provide a frame, as shown in FIG. 3a. A pellicle 19 is deposited onto the notched substrate 38 as shown in FIG. 3b. The substrate 38 is then back-etched to provide the pellicle assembly 35 having a frame 39, as shown in FIG. 3c. After back etching, the notches 36, 37 result in the frame 39 comprising two expansion structures in the form of leaf springs (e.g. v-shaped formations) 36', 37'. The leaf springs 36', 37' reduce the pre-stress of the pellicle 19 in the x-dimension (i.e. the scanning direction).

Figure 4:
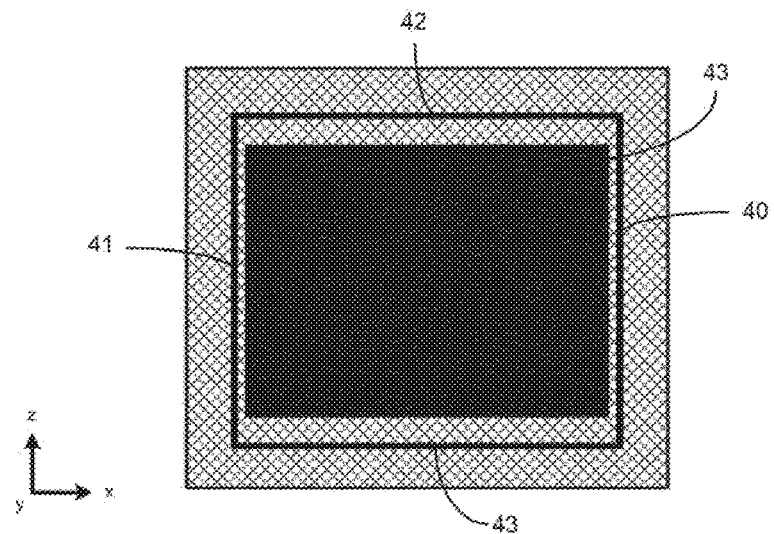
FIG. 4 schematically depicts the pellicle of FIG. 3 in top-down view.

The length and thickness of the leaf springs 36', 37' may be controlled by adjusting the depth of the notches 36, 37 (i.e. their extent in the z dimension) and their position on the x-y plane of the substrate 38. In this way, the reduction in stress provided by the leaf springs 36', 27' may be controlled. Further, the stiffness of the leaf springs may be adjusted independently in both the scanning (x) and non-scanning (y) dimensions. For example, as depicted in FIG. 4, notches may be positioned on a substrate to provide a lower stress in the scanning direction (x) than in the non-scanning direction (y). In particular, in FIG. 4, notches 40, 41 are positioned closer (in the x-dimension) to a desired image field 42, thereby resulting a relatively flexible leaf spring, while notches 43, 44 may be positioned further from the desired image field 42 (in the y-dimension) to create stiffer leaf springs.

Figure 5:
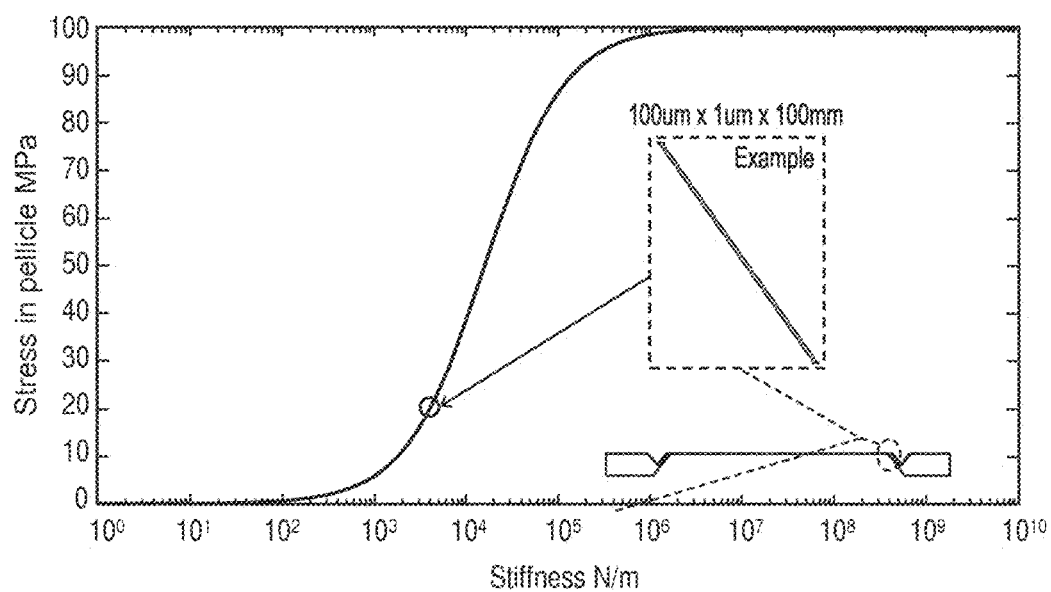
FIG. 5 is a graph showing how stress in a pellicle varies with stiffness of the expansion structures shown in FIG. 3.

FIG. 5 is a graph showing how the stress in a pellicle varies as a function of the stiffness of a leaf spring (such as the leaf springs 36', 37'). It can be seen from FIG. 5 that by varying the stiffness of a leaf spring 36', 37', it is possible to control, within wide bands, the pre-stress within a pellicle.

The use of one or more expansion structures can therefore increase the margin between the pre-stress within the pellicle after production and the ultimate tensile stress of that pellicle, thereby improving the lifetime and reliability off the pellicle. Additionally, in the event of catastrophic failure of the pellicle, the reduced tension achieved through the expansion structure means that there is less elastic energy stored within the pellicle. As such, there is a lower likelihood that breakage of the pellicle will result in pieces of the pellicle would be emitted into other areas of the lithographic apparatus.

Figure 6A:
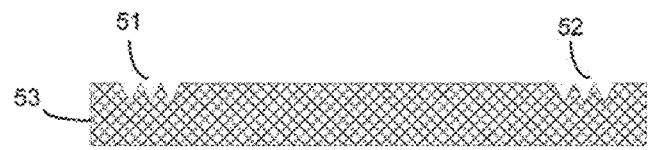
FIGS. 6a, 6b, 6c and 6d schematically depict stages of construction of a pellicle assembly having different expansion structures.
Figure 6B:
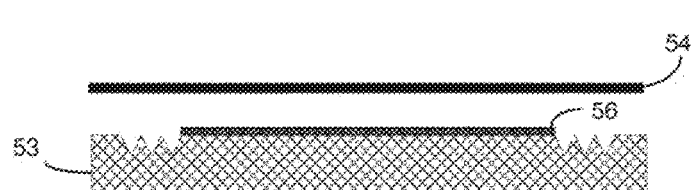
Figure 6C:
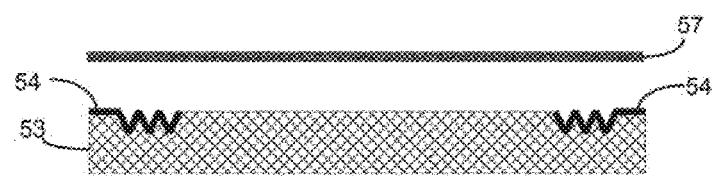
Figure 6D:
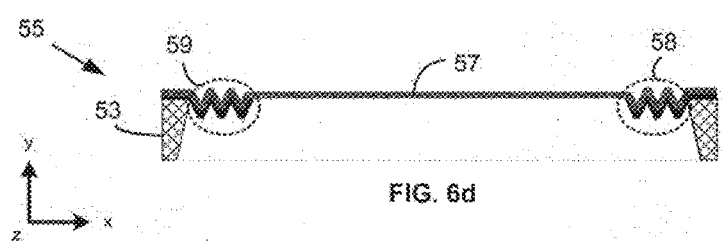

It will be appreciated that while expansion structures comprising a single notch are depicted in FIGS. 3 and 4, expansion structures having additional notches and/or other patterns may be etched into the substrate from which the pellicle frame is formed so as to provide expansion structures of differing properties. In this way, pellicles having differing pre-stresses may be provided. In some embodiments, additional layers may be utilized in the manufacture of pellicle assemblies in order to provide more complex expansion structures. For example, FIG. 6 schematically illustrates stages of manufacture of a pellicle assembly 55 (FIG. 6d). The pellicle assembly 55 is manufactured by etching serrations 51, 52 into a substrate 53 (e.g., a silicon wafer). A spring layer 54 is deposited onto the substrate 53 such that the spring layer 54 is received within and takes the form of the serrations 51, 52. The spring layer 54 may be formed of, for example, metals such as copper, gold, silver, etc. In other embodiments, the spring layer 54 may be formed from other materials such as SiOx, SiN or MoSi. A shield layer 56 is deposited between the substrate 53 and the spring layer 54 over a desired image field. The shield layer 53 need not be deposited within the serrations 51, 52. Removal of the shield layer 53 after depositing the spring layer 54 results in the arrangement illustrated in FIG. 6c, in which the spring layer 54 is restricted to the areas generally within the serrations 51, 52. A pellicle layer 57 is deposited onto the spring layer 54 and the substrate 53. Back-etching of the substrate 53 provides the pellicle assembly 55 having two expansion structures 58, 59. In addition to the properties of the serrations 51, 52 (e.g., depth, width) the properties of the spring layer 54 may be selected to obtain a desired pre-stress within the pellicle 57, and pellicle frames with very low stiffness levels may be achieved. It will be appreciated that while a single spring layer 54 is depicted in the exemplary arrangement of FIG. 6, in other embodiments more than one spring layer may be provided. Where more than one spring layer is provided, spring layers of different materials may be provided.

Figure 7:
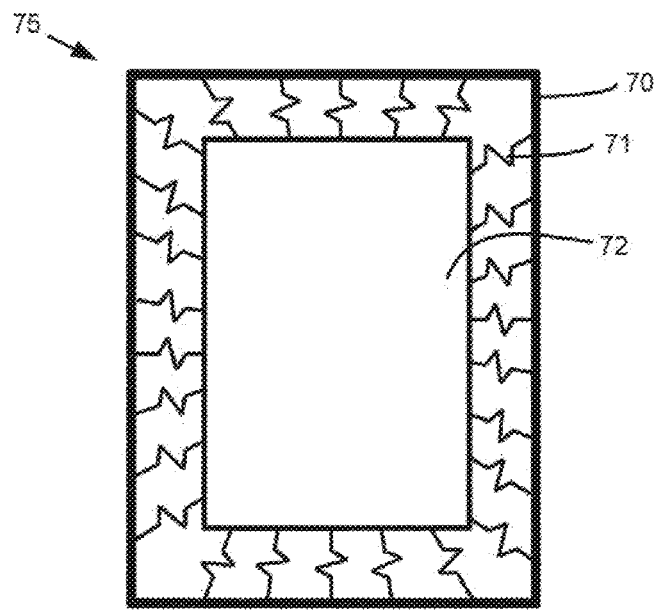
FIG. 7 schematically depicts a pellicle assembly having a plurality of expansion structures.

In some embodiments, the substrate and/or spring layer(s) may be etched so as to isolate the expansion structures from one another. In a theoretically ideal arrangement, a pellicle may be suspended from a pellicle frame by way of an infinite number of expansion structures (e.g., springs), each expansion structure having no internal connection with any other of the expansion structures. While it is not possible to provide an infinite number of expansion structures, it will be appreciated from the teaching herein that different etching patterns may be utilized within the general techniques described above to isolate each expansion structure from each other expansion structure. FIG. 7 schematically illustrates a top-view of a pellicle frame 75, in which a frame 70 has been etched to provide a plurality of isolated expansion structures in the form of springs 71, supporting a pellicle 72.

Figure 8:
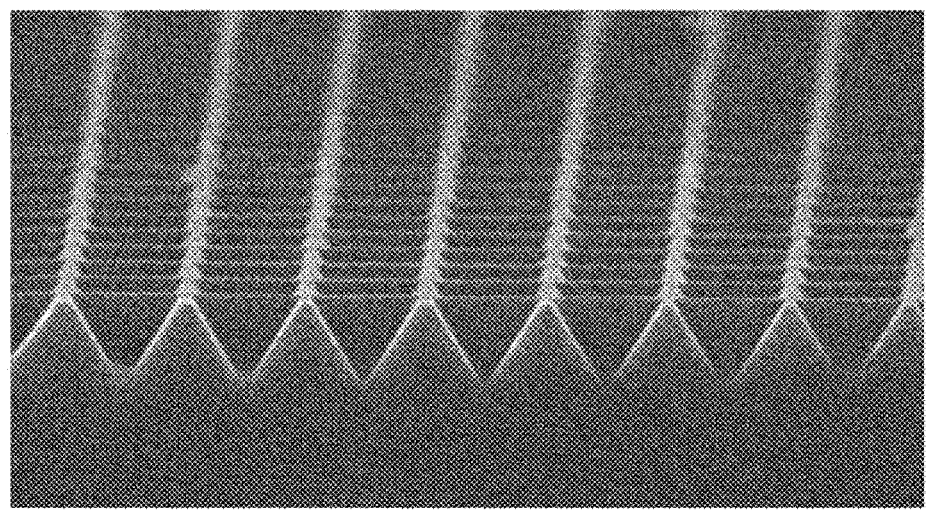
FIG. 8 depicts a substrate etched to provide expansion structures which act in two dimensions.

While the above examples have described expansion structures which operate in a single dimension, expanding and contracting along the x-axis in FIGS. 3 and 6, in other embodiments expansion structures may be formed which act in a plurality of dimensions so as to control stress within the pellicle in both x and z dimensions. FIG. 8 is a photograph showing a perspective view of a substrate that has been etched to provide expansion structures which act in both the depicted x and z dimensions.

Figure 9A:
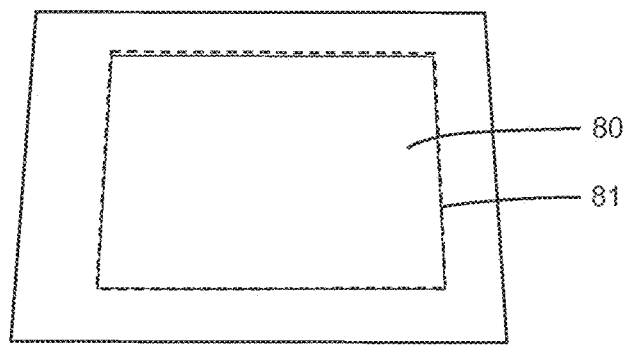
FIGS. 9a and 9b depict a substrate provided with herringbone expansion structures.
Figure 9B:
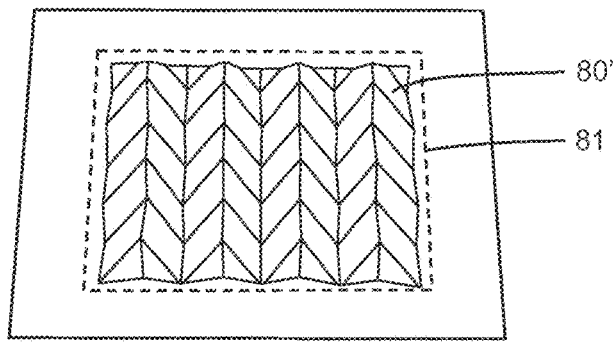

In an embodiment, the pellicle frame may be etched to provide what is referred to as a "herringbone" pattern, which comprises a saw-tooth-like (or zig-zag) structure in the x-y plane, the z-y plane and the z-x plane. FIG. 9a is a photograph illustrating a membrane 80 having outer limits schematically depicted in dashed outline 81. Referring to FIG. 9b, the membrane 80 has been folded to provide a herringbone structure 80'. It can be seen that with the herringbone structure 80', the membrane 80 is smaller than the outer limits 81.

Figure 10:
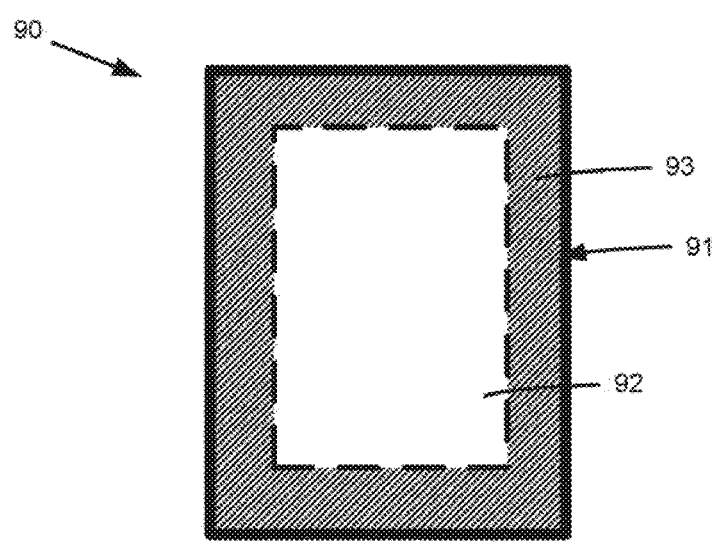
FIG. 10 schematically depicts a pellicle assembly having herringbone expansion structures along an edge portion of the pellicle assembly.

The herringbone structure may be utilized in a plurality of ways within a pellicle assembly. In one embodiment, the herringbone structure is applied to an outer portion of a pellicle assembly. Referring to FIG. 10, a pellicle assembly 90 comprises a pellicle 91 having an image field (or center) portion 92 and an expansion structure in the form of a herringbone portion 93 on a frame (or edge) portion of the pellicle assembly 90. In FIG. 10, the herringbone structure is schematically illustrated with hatching. The herringbone patterned edge portion 93 may be constructed according to the techniques described above with reference to FIG. 6, for example using a different etching pattern.

Figure 11:
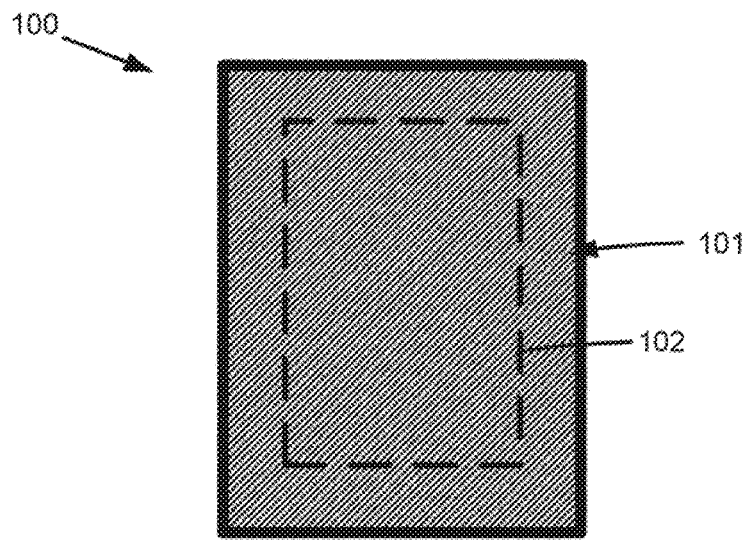
FIG. 11 schematically depicts a pellicle assembly having herringbone expansion structures across a surface of a pellicle.

In another embodiment, the entire surface of a pellicle may be formed so as to comprise a herringbone structure. Referring to FIG. 11, there is shown a pellicle assembly 100 in which an entire pellicle 101, including an image field portion 102, comprises a herringbone structure (schematically illustrated with hatching). By forming the entire pellicle 101 with a herringbone structure as in the exemplary arrangement of FIG. 11, the entire surface of the pellicle 101 contributes to the reduction in pre-stress across the pellicle 101. In tests, a pellicle with a herringbone pattern has been modelled using the finite element method, the results of which have shown that an average stress within a pellicle may be reduced by more than a factor of 10, while the maximum stress experienced by any part of the pellicle is reduced by more than a factor of 6, in comparison to a pellicle without a herringbone structure.

Where a herringbone structure is applied across the entire surface of the pellicle (or at least the majority of the surface of the pellicle), the pellicle may be formed so as to have a total pre-stress of zero Pa. In an exemplary embodiment, the out-of-plane structure (i.e. the extent of the expansion structure(s) in the z-dimension) is of the order of 0.1 mm-0.5 mm and the herringbone pattern has a spatial frequency of 0.2 mm-1 mm. In such an embodiment, since the additional surface area provided by the herringbone structure (compared to a flat pellicle) is orders of magnitude more than the shrinkage of the pellicle during production, the pellicle will have no pre-stress after construction. Surprisingly, while a pellicle with no pre-stress would normally sag unacceptably during use (i.e. sagging which leads to particles on the pellicle being brought into the focal plane), it has been found that a herringbone structure has an additional benefit in that it introduces significant bending stiffness to the pellicle compared to a flat pellicle, in at least in one direction. Referring to FIG. 12, a pellicle 120 having a herringbone structure is illustrated. The herringbone structure of the pellicle 120 provides relatively high bending stiffness for bending around an axis 121, leading to reduced sagging of the pellicle 120, with a lower bending stiffness around axis 122. The bending stiffness introduced by the herringbone structure suppresses out-of-plane deviations (e.g. sagging in the z-dimension) during use.

The use of one or more expansion structures comprising herringbone structures, either across an entire pellicle or on an outer (e.g., frame, edge or non-image field) portion of a pellicle can therefore increase the margin between the pre-stress within the pellicle after production and the ultimate tensile stress of that pellicle, thereby improving the lifetime and reliability off the pellicle. Additionally, in the event of catastrophic failure of the pellicle, the reduced tension achieved through the herringbone structure means that there is less elastic energy stored within the pellicle. As such, there is a lower likelihood that breakage of the pellicle will result in pieces of the pellicle would be emitted into other areas of the lithographic apparatus.

A herringbone pattern may be formed within a pellicle using the methods generally set out above. That is, the herringbone pattern may first be etched into a substrate (e.g., a silicon wafer) prior to depositing of the pellicle on the substrate and prior to back-etching of the substrate. In comparison to the methods described above with reference to FIGS. 3 and 6, to provide a herringbone across the entire surface of the pellicle, the entire surface of the substrate may be pre-etched, rather than only an outer portion of the substrate which is to form the pellicle frame. In other embodiments, stress in the pellicle may be tuned by introduction of localized portions of herringbone patterns only where it is expected that the pellicle will be subjected to a heat load during use.

Figure 13A:
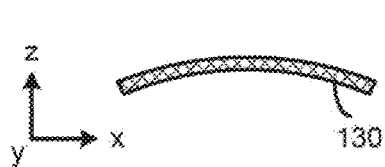
FIGS. 13a, 13b and 13c schematically depict mechanical bending of a pellicle assembly to reduce tension of a pellicle.
Figure 13B:
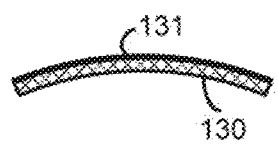
Figure 13C:
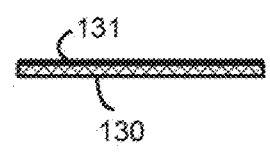

In an embodiment, stress within a pellicle may be controlled through mechanical bending of the substrate prior to depositing the pellicle material onto the substrate. For example, with reference to FIG. 13a, a substrate 130 may be mechanically bent into a bow shape. A pellicle 131 may be deposited onto the outer (convex) surface of the bowed substrate 130 (FIG. 13b). Finally, the mechanical load within the substrate 130 may be released, thereby introducing mechanical compression into the pellicle 131 (FIG. 13c). Due to the mechanical compression introduced into the pellicle 131, the tension within the pellicle 131 following further production steps (e.g. back-etching, annealing, etc.), will be lower than if the pellicle 131 was deposited onto an initially flat substrate.

Figure 14A:
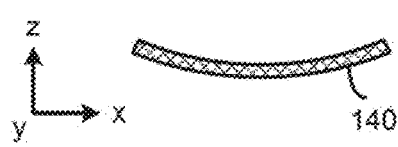
FIGS. 14a, 14b and 14c schematically depict mechanical bending of a pellicle assembly to increase tension of a pellicle.
Figure 14B:
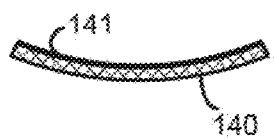
Figure 14C:
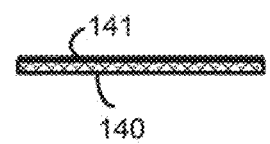

Bending of the substrate prior to depositing the pellicle material onto the substrate may also be used to increase tension. For example, with reference to FIG. 14a, a substrate 140 may be mechanically bent into a bow shape. A pellicle 141 may then be deposited onto the inner (concave) surface of the bowed substrate 140 (FIG. 14b). Finally, the mechanical load within the substrate 140 may be released, thereby introducing mechanical tension.

The stress that is mechanically added or removed from the pellicle as a function of curvature radius of the substrate on which the pellicle is deposited during manufacture may, in some embodiments, be calculated similarly to "Stoney's equation":

$$\sigma_f = \frac{E_s h_s^2}{6 h_f (1 - v_s) R}$$

where $E_s$ is the Young's modulus of the substrate, $h_s$ is the thickness of the substrate, $h_f$ is the thickness of the pellicle, $v_s$ is the Poisson ratio of the substrate and R is the radius of curvature of the substrate that has been mechanically introduced through bending. It will be appreciated, however, that the amount of stress added or removed may be different and may be less.

It is to be understood that control of stress within a pellicle through mechanical bending is not limited to a single layer and can be replicated with every additional layer of a pellicle that is deposited on the substrate. In this way, the stress of individual layers of the pellicle may be tuned as desired. Further, use of mechanical bending may be used to control stress in more than one direction. For example, the substrate may be mechanically bent in different directions. A bending direction may be different for different layers of a pellicle.

Further, a feedback loop may be provided in which a sensor (not shown) is provided to measure forces that occur during depositing of the pellicle as a pellicle layer grows thicker. The mechanical bending of the substrate may then be controlled to guarantee the same stress throughout the entire thickness of the pellicle layer based on the feedback. Feedback may be especially beneficial in the first atomic layers of the pellicle as stress develops differently in the first atomic layers than in the 'bulk' of the pellicle.

Figure 15:
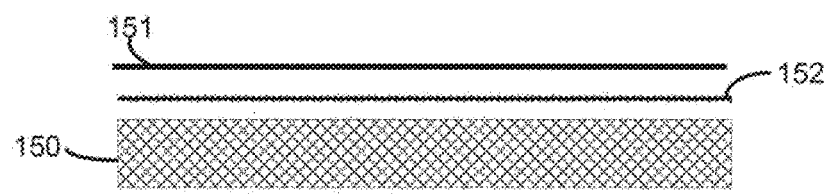
FIG. 15 schematically depicts construction of a pellicle having expansion structures provided by surface roughness.

It was described above with reference to FIGS. 11 and 12 that a herringbone pattern may be created across the entirety of a pellicle surface. In an alternative embodiment, other patterns or random "roughness" may be introduced into the pellicle during manufacture in order to lower the final pre-stress of the pellicle. Similarly to the methods described above, in order to introduce "roughness" into a pellicle roughness may be introduced onto the surface of the substrate onto which the pellicle is to be deposited. A number of mechanisms may be used to introduce roughness onto the surface of the substrate. For example, with reference to FIG. 15, a low temperature plasma-enhanced chemical vapor deposition (PECVD) oxide layer 152 (for example silicon dioxide) may be provided on the surface of a silicon substrate 150. The PECVD oxide layer 152 provides a back "etch-stop" layer on which a pellicle 151 is deposited. Low temperature PECVD oxide has a much larger inherent roughness than silicon. The pellicle 151 will take on this roughness when it is deposited on the PECVD oxide layer 152.

In other embodiments, potassium hydroxide (KOH) may be used to etch the surface of the silicon substrate onto which the pellicle is to be deposited. In particular, a resist may first be deposited onto the silicon substrate and the deposited resist patterned with a pattern using lithography. For example, a checkerboard pattern may be formed within the resist. After lithographically forming a pattern within the resist, the silicon may be etched (e.g. using KOH). For example, the silicon may be etched to create inverse pyramid shapes, the inverse pyramid shapes providing the desired roughness. The resist may then be removed and the substrate cleaned. The cleaned substrate may be oxidized with thermal oxide to round any sharp edges created during the etching and to create an "etch stop". The pellicle may then be deposited onto the oxidized substrate ready for normal pellicle manufacture.

It will be appreciated that other etchants may be used. For example, in other embodiments, an isotropic dry or wet etch may be used. In another embodiment, roughness may be created through isotropic etching of silicon dioxide, before removal of the resist.

The addition of "roughness" to the pellicle may be restricted to portions of the pellicle, rather than provided across the entire surface of the pellicle. For example, similarly to the way in which a spring is created in the embodiment described with reference to FIGS. 3 and 6, roughness may be added to the pellicle along one or more edge portions of the pellicle, or at other portions of the pellicle. For example, stress in the pellicle may be tuned by introduction of localized portions of roughness only where it is expected that the pellicle will be subjected to a heat load during use.

Figure 16:
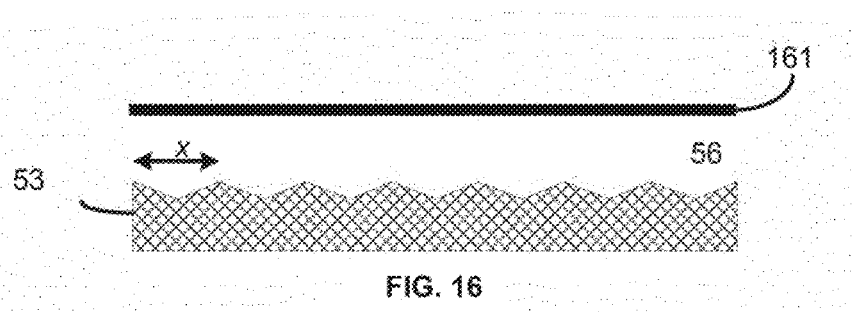
FIG. 16 schematically depicts an alternative construction of a pellicle having expansion structures provided by surface roughness.

The lateral dimension of features created by addition of roughness or patterns to the pellicle is preferably larger than the thickness of the pellicle. For example, with reference to FIG. 16, a lateral dimension X of the features (which are depicted as forming a triangular pattern in the exemplary arrangement of FIG. 16) is larger than the thickness y of the pellicle layer 161.

In some embodiments, the dimensions and configuration of the roughness added to the pellicle may be selected such that it provides approximately between 0.045-0.096% extra surface-area across the pellicle than is provided by a flat pellicle. Once the pellicle is freestanding (e.g., after other steps of the manufacture of the pellicle assembly such as back-etching) then the stress compared to that provided by a flat pellicle, will be reduced by a function of the extra surface area translated through the Young's modulus of the pellicle material.

The pellicle may be attached to the pellicle frame using adhesive. Manually dispensing the small amounts of adhesive necessary to attach a pellicle to a pellicle frame may be difficult due to process variations and operator inaccuracies. Issues may occur, for example, when too much adhesive is applied (process variations) and the portions of adhesive are positioned too far to an inner side of the frame. Capillary effects between the frame and the pellicle may result in adhesive travelling inside the enclosed volume between the pellicle and the patterning device MA. Adhesive inside the enclosed volume can result in serious contamination of the patterning device.

Figure 17:
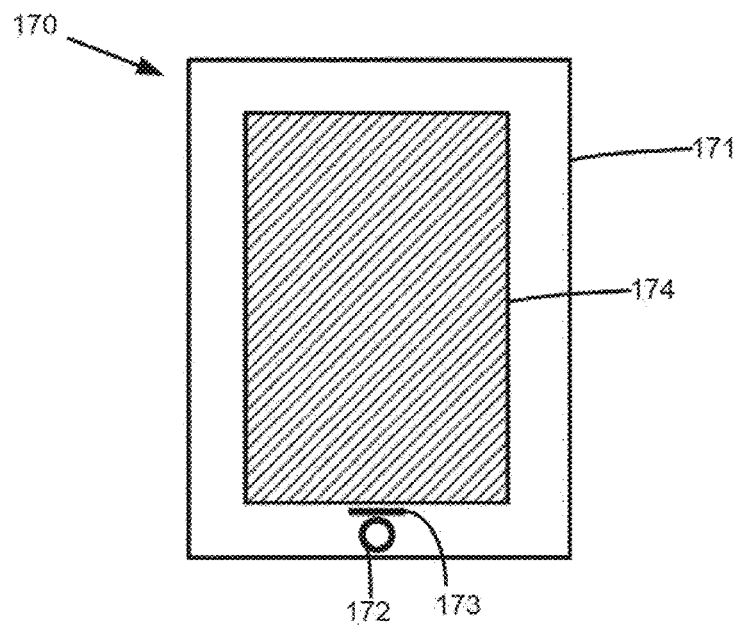
FIG. 17 schematically depicts a pellicle frame comprising an adhesive boundary.

FIG. 17 schematically depicts a pellicle frame 171. The pellicle frame comprises a frame border with an inner edge 174. Beyond the inner edge 174, a central portion of pellicle is not in direct contact with the frame. A circular boundary 172 is provided on the frame border. The circular boundary 172 has been engraved within the material of the frame (which may be, for example, silicon). It has been found that by providing engraved circles on the frame border, the circles provide a centering function for adhesive supplied in a central area of the circus. A droplet of adhesive with high contact angle starts wetting immediately after dispensing. The circular boundary 172 acts as barrier causing the adhesive to self-center within the boundary 172.

Figure 18A:
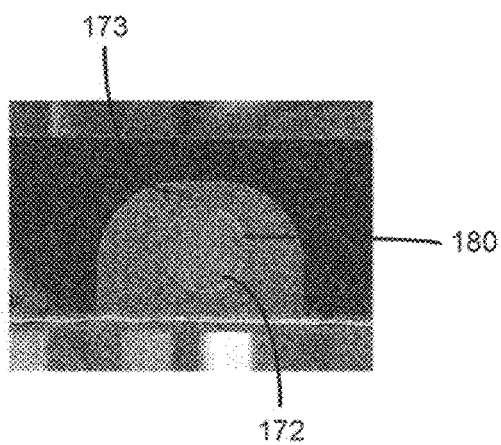
FIGS. 18a and 18b depict a pellicle frame comprising an adhesive boundary.

An additional boundary 173 is also provided. In the depicted embodiment, the additional boundary 173 takes the form of a straight line engraved into the frame 171. The additional boundary 173 acts as a further barrier in the event that too much adhesive is applied. FIG. 18a is photograph showing the centering effect of the circular boundary 172, where it can be seen that adhesive 180 has formed a generally centered circular dot of adhesive which is generally concentric with the circular boundary 172. In the depicted embodiment, the diameter of the circular boundary 172 is of the order of 1.4 mm.

The circular boundary 172 and the additional boundary 173 may be provided by etching the substrate. For example, the boundaries 172, 173 may be laser etched into a silicon substrate.

Figure 18B:
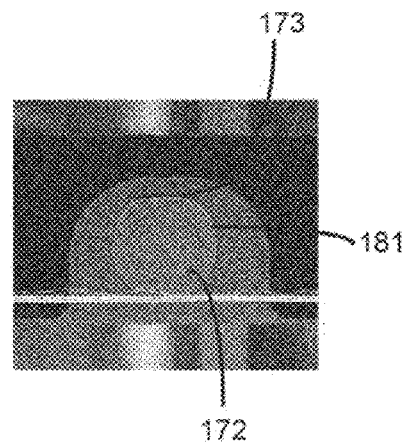

FIG. 18b is a photograph showing a situation in a dot of adhesive 181 comprising too large a volume added to the pellicle frame 171. In FIG. 18b, it can be seen that the additional boundary 173 acts as a further barrier, preventing the adhesive 181 from spreading beyond the internal border 174 of the frame where it can contaminate the enclosed volume between the pellicle and the patterning device MA.

The provision of a circular boundary 172 and/or an additional boundary 173 significantly reduces the risk of adhesive reaching the enclosed volume and improves the ease and accuracy of dispensing of adhesive, which may be performed manually.

It will be appreciated that the pellicle frame to which the pellicle is attached is relatively stiff in comparison to the pellicle itself. The stiffness of the frame, in combination with the pre-stress that is added to the pellicle, as described above, can cause problems with wrinkling of the pellicle when temperatures rise during scanning operations. During scanning, temperatures may rise by up to several hundreds of degrees C.

Figure 19A:
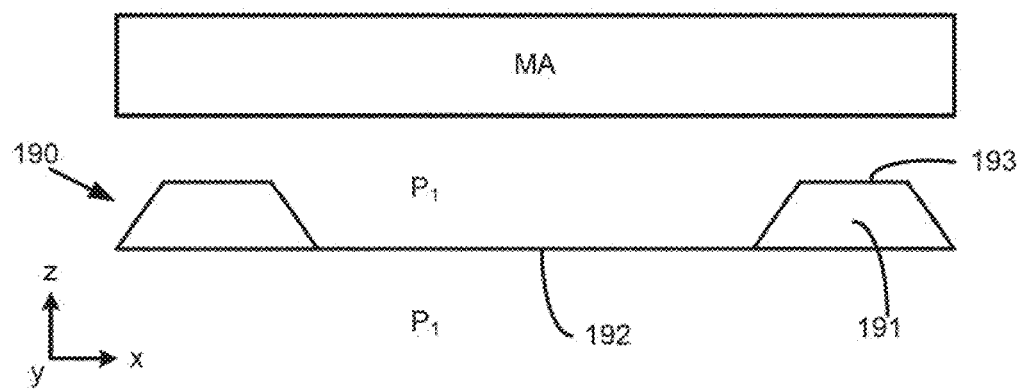
FIG. 19a depicts a pellicle assembly in an open configuration.
Figure 19B:
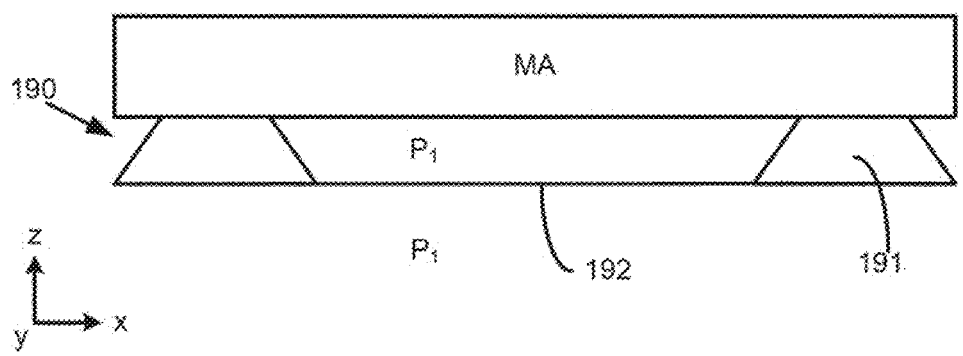
FIG. 19b depicts a pellicle assembly in a closed configuration.

In an embodiment, a mechanism is provided to translate the pellicle frame in directions towards and away from the patterning device MA, so as to close and open the area between the pellicle and the patterning device MA. Referring to FIG. 19, a pellicle assembly 190 is shown together with the patterning device MA. The pellicle assembly 190 comprises a pellicle frame 191 and a pellicle 192. Actuators (not shown) are provided to translate the pellicle assembly along the depicted z-dimension. In FIG. 19a, the pellicle assembly is shown in an open configuration, in which the pellicle assembly 190 is spaced apart from the patterning device MA. In the open configuration, the pressure in the volume between the pellicle 192 and the patterning device MA is the same, denoted $P_1$ in FIG. 19a.

It will be appreciated that the actuators may take any appropriate form as will be apparent to persons skilled in the art.

The actuators are configured to allow the pellicle assembly 190 to transition to a closed configuration, by translating the pellicle assembly 190 towards the patterning device MA until the pellicle frame 191 is in physical contact with the patterning device MA. In the closed configuration, the volume between the patterning device MA and the pellicle 192 is physically separated from the external environment surrounding the patterning device MA. The pellicle frame 191 may comprise sealing members (not shown) on surfaces 193 which are arranged to contact the patterning device MA. The patterning device MA may comprise corresponding sealing members (not shown) for interfacing with the pellicle frame 191.

In FIG. 19a, the pressure in the enclosed volume between the pellicle 192 and the patterning device MA is still the same pressure, $P_1$ as the pressure around the patterning device MA.

Figure 19C:
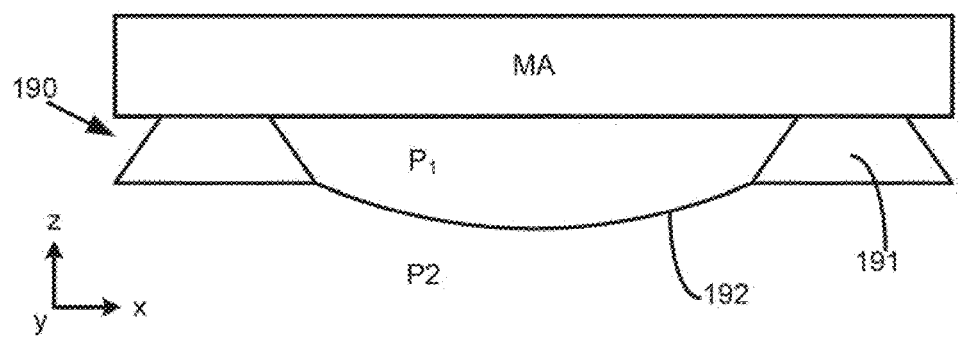
FIG. 19c depicts the pellicle assembly of FIG. 19b after flushing a surrounding volume.

During a scanning operation, the pellicle assembly 190 may be transitioned to the closed configuration and gasses may be flushed from the environment surrounding the patterning device MA and the pellicle assembly 190, thereby lowering the pressure in the environment surrounding the patterning device MA. As depicted in FIG. 19c, after flushing the surrounding area, the pressure in the volume between the patterning device MA and the pellicle 192 is greater than the pressure (denoted $P_2$ in FIG. 19c) surrounding the patterning device MA. As such, the pellicle 192 may bow away from the patterning device MA in the z-dimension.

Prior to transitioning the pellicle assembly 190 from the open configuration to the closed configuration, the ambient pressure surrounding the patterning device MA (denoted $P_1$ in FIG. 19a) may be selectively adjusted. For example, in some embodiments, the pressure may be brought to approximately 2 Pa through the introduction of a gas, such as, for example, hydrogen gas.

By increasing the pressure between the patterning device MA and the pellicle 192, a thermal connection to the patterning device is improved. This allows for greater cooling through conduction through the gas in the volume between the patterning device MA and the pellicle 192. Pressure may also be increased from the other side of the pellicle 192, in order to thereby decrease the pressure difference over the pellicle 192. In this way, the pressure difference over the pellicle 192, and therefore controlling the tension in the pellicle 192.

By ensuring that the tension in the pellicle 192 induced through the difference in pressures $P_1$, $P_2$ is greater than the tension in the pellicle 192 induced by the frame 191, the pellicle 192 will wrinkle significantly less when subjected to a high heat load during scanning operations. Additionally, by closing the volume between the pellicle 192 and the patterning device MA, continuation cannot enter that volume during scanning operations.

In the embodiments described above, it is indicated that the substrate onto which the pellicle is deposited may be a crystalline silicon wafer. The bias within the art for the use of crystalline silicon as a substrate for pellicles has a number of reasons, including that the industry has vast experience in processing crystalline silicon wafers. Additionally, the coefficient of thermal expansion (CTE) of crystalline silicon wafers (2.6 um/m/K) matches the CTE of polycrystalline pellicle materials (approximately 4 um/m/K), such that relatively little thermal stress is introduced during the fabrication process. Crystalline silicon therefore quickly became the default surface onto which pellicles are grown, even where pellicles are constructed from materials having different CTEs than polycrystalline pellicle materials.

In some embodiments, pellicles may be constructed from $MoSi_2$, having CTEs of approximately 8 um/m/K or graphite-based materials, with CTEs of approximately 1 um/m/K. As described above, during annealing at high temperatures (e.g., approximately 800 degrees Celsius) to improve the microstructure of the pellicle, the internal stresses within the pellicle assembly are small, (e.g., close to zero). However, during cool-down (e.g. to room temperature), large CTE mismatches are introduced between the pellicle and the substrate, resulting in the build-up of stresses, contributing to the large pre-stress within the pellicle assembly, as described above.

Figure 20A:
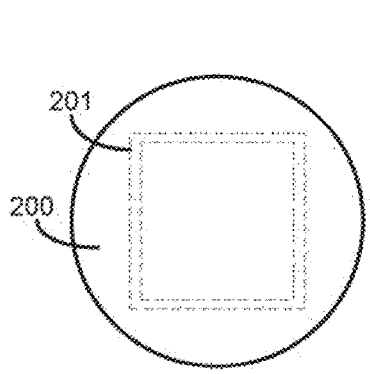
FIGS. 20a-20c schematically depict stages of manufacturing a pellicle frame according to an embodiment.
Figure 20B:
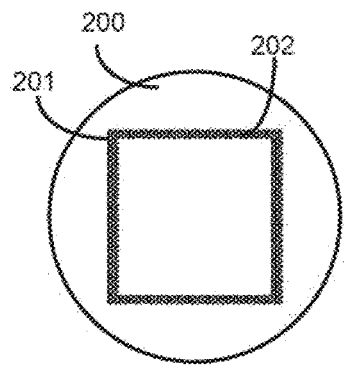
Figure 20C:
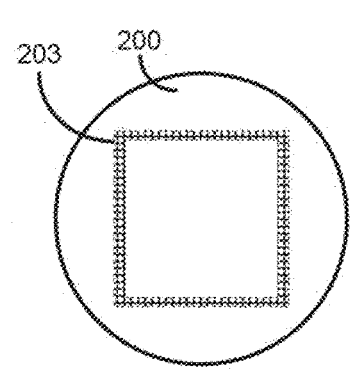

In an embodiment, the CTE of the pellicle frame is adjusted by creating a pellicle frame that is formed from a composite material. Referring to FIG. 20a, there is depicted a silicon wafer 200 that is to form the pellicle frame of a pellicle assembly. It will be appreciated that in other embodiments, the substrate may be a different material.

A border region 201 is defined on the substrate 200, defining the edges of a pellicle frame. While the border region 201 is shown as having a generally rectangular shape in FIG. 20a, it is to be understood that other shapes may be used. For example, a circular shaped pellicle frame may introduce less stress concentrations within the pellicle, and may therefore be particularly beneficial in some embodiments. Portions of silicon from within the border region 201 of the substrate 200 are removed to form a region 202 containing one or more areas for receipt of another material. The removed areas are filled with a second (or filler) material having a different CTE to silicon to form a composite region 203. Construction of a pellicle assembly using the substrate 200 may then proceed as normal. The composite region 203 ensures that the pellicle frame of a pellicle assembly constructed using the substrate 200 has a desired CTE. The CTE may be adjusted by selecting the filler material and by selecting the way in which the filler material is distributed within the border region 201.

Figure 21A:
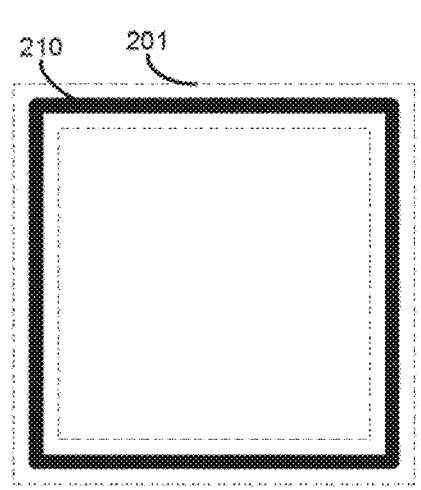
FIGS. 21a-21b schematically depict alternative examples of a pellicle frame.
Figure 21B:
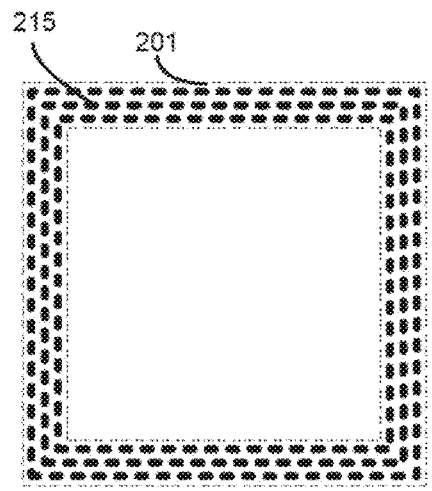

For example, in one embodiment, silicon may be removed from the border region 201 in a continuous band 210 as depicted in FIG. 21a. In an alternative embodiment, the border region 201 may be perforated to define a plurality of perforations 215. The filler material may then be applied so that it fills the perforations. It will be appreciated that the arrangements depicted in FIGS. 21a, 21b are merely exemplary and that material may be removed from the border region 201 in any arrangement.

Figure 22:
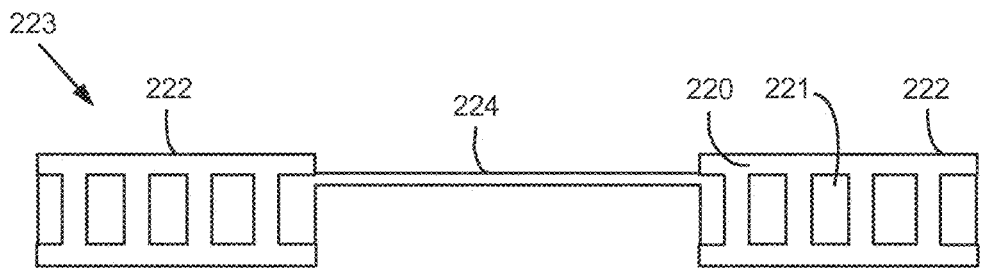
FIG. 22 schematically depicts a pellicle assembly having a pellicle frame according to an embodiment.

In an embodiment, after filling, the filler material may partially or completely surround the border region. FIG. 22 shows a cross-section through a pellicle assembly 223 in which filler material 220 is resident within and around perforations within a silicon substrate 221, thereby surrounding the silicon substrate 221. Together, the silicon substrate 221 and the filler material 220 form a pellicle frame 222. In FIG. 22, the substrate has been back-etched to form the pellicle assembly 223 having a pellicle 224.

Using a filler material, the CTE of the pellicle frame may be either decreased or increased so as to increase or decrease the pre-stress within the pellicle.

The filler material may be any appropriate material that has a different CTE to the substrate material onto which the pellicle will be deposited (in an example, silicon) and from which the pellicle frame will be formed. By way of example only, the filler material may be a material having a relatively high CTE. Preferably, the filler material is a ductile material.

Preferably, the filler material is a material that does not outgas. In an example embodiment, the filler material is a metal. In a particular example, the filler material is aluminum or molybdenum, for example. In an embodiment, different amounts of the substrate may be removed at different parts of the border portion. In this way, additional, localized, control may be achieved over the pre-stress within the pellicle assembly.

Figure 23A:
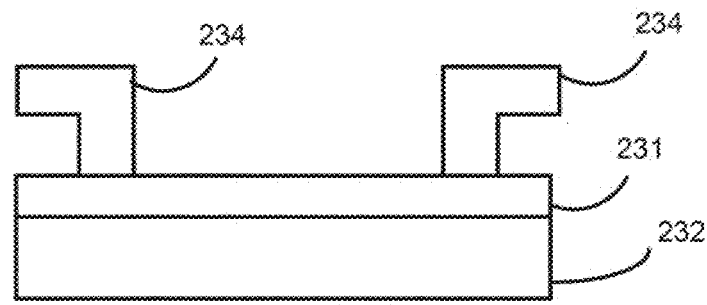
FIGS. 23a-23b schematically depict stages of manufacturing a pellicle assembly according to another embodiment.
Figure 23B:
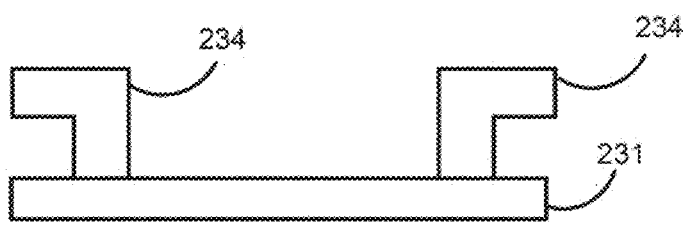

As described above, once the filler material has been added to the substrate, all other processing steps to manufacture the pellicle assembly may be beneficially unchanged, such that the use of a composite frame may be easily introduced into an existing manufacturing process. In an embodiment, rather than utilizing the substrate to form the pellicle frame, a pellicle frame may be bonded pellicle in a separate operation. The substrate may then be completely etched (such that no part of the substrate remains in the pellicle assembly). Construction stages of an example pellicle assembly 230 are depicted in FIG. 23, in which a pellicle 231 has been deposited onto substrate 232. The substrate may be, for example, crystalline silicon. Once the pellicle 231 has been deposited onto the substrate 232, the pellicle may be annealed as per a conventional pellicle manufacturing method. After annealing, however, a frame 233 may be bonded to the pellicle 231. The frame 233 is bonded to the opposite side of the pellicle to the side which is in contact with the substrate 232. The substrate may then be entirely back-etched to remove the substrate, leaving the pellicle assembly 230 comprising the pellicle 231 and the frame 234. In this way, the pre-stress within the pellicle after manufacture is dependent upon the difference in CTE between the pellicle 231 and the frame 234 and the temperature at which the bonding of the frame 234 to the pellicle 231 occurred.

It will be appreciated that the term "bonded" as used herein is used to differentiate the process by which the pellicle is deposited onto the substrate. That is, while in prior arrangements, the pellicle adheres to the substrate after it has been deposited on the substrate, this is different to the present arrangement in which the frame is bonded to the pellicle after the pellicle has been annealed.

The frame 234 may be constructed from any material, such that the CTE of the frame 234 may be selected in dependence upon the desired properties of the pellicle assembly such as pre-stress. Further, the method (and therefore the temperature) of bonding the frame 234 may be selected to further obtain desired properties of the pellicle assembly 230. For example, in one embodiment, the pellicle frame 234 may comprise a lithium-aluminosilicate glass-ceramic such as ZERODUR® ceramic material, from Schott AG. ZERODUR material has a very low CTE and therefore little to no expansion, resulting in very low forces exerted on the pellicle and on the patterning device MA.

In an embodiment, the frame 234 may comprise silicon and it may be desired to provide a pre-stress within the pellicle 231 in the range of 100 to 250 MPa, for example approximately 200 MPa. In order to achieve a pre-stress of approximately 200 MPa, the frame 234 may be bonded to the pellicle 231 at a temperature below approximately 160 degrees Celsius. For example, bonding techniques such as optical contact bonding and hydrogen bonding may be used, which operate at temperatures of between approximately 20 to 25 degrees Celsius. Other example bonding techniques which may be used with a silicon frame to obtain a pre-tension of approximately 200 MPa include gold diffusion bonding (operating at a temperature of approximately 50 degrees Celsius) and anodic bonding (operating at a temperature of approximately 160 degrees Celsius).

Figure 24:
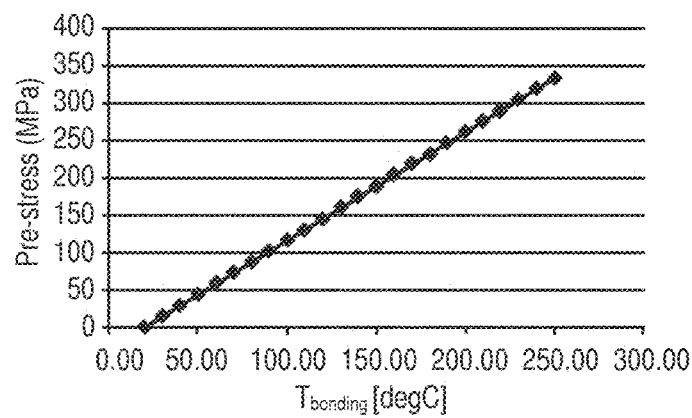
FIG. 24 is a graph indicating how a pre-stress within a pellicle changes with respect to a bonding temperature in the method depicted in FIG. 23.

It will be appreciated that where a different amount of pre-stress is desired within the pellicle 231, different bonding temperatures may be selected. FIG. 24 is a graph showing how the pre-stress within a MoSi pellicle increases with the temperature at which a silicon frame is bonded to the pellicle. It will be appreciated that the desired pre-stress may depend on a large number of factors including, for example, the composition of the pellicle 231. By way of example, in an embodiment using a graphite-based pellicle 231, a pre-stress in a range of from 300 MPa to 450 MPa, for example approximately 400 MPa may be desired and the material of the pellicle frame 234 and the temperature of the bonding may be selected accordingly. In particular, the pre-stress a within the pellicle 231 at a given temperature T may be given by:

$$\sigma = -E_{pellicle}((CTE_{pellicle} - CTE_{frame})/(1 - V_{pellicle}))(T - T_{bonding})$$

where $E_{pellicle}$ is the Young's modulus of the pellicle, $CTE_{pellicle}$ is the CTE of the pellicle, $CTE_{frame}$ is the CTE of the pellicle frame, $v_{pellicle}$ the Poisson ratio of the pellicle and $T_{bonding}$ is the temperature of bonding.

The method described with reference to FIG. 23 may be additionally advantageous in that the frame may be constructed in any size and shape desired. In other methods of constructing a pellicle assembly, the pellicle frame formed from the etched substrate onto which the pellicle is grown may be assembled onto a further frame for placement on the patterning device. The method described with reference to FIG. 23 advantageously avoids further construction (e.g. gluing, assembly), and reduces the number of interfaces between components, thereby reducing the generation of particles which may cause contamination and reducing stresses exerted on the pellicle 231 during manufacture. That is, the pellicle frame may be formed from a single piece, rather than from a residual substrate border and the addition of a further frame element. Additionally, construction of the frame 234 may be more straightforward than for other pellicle assembly construction techniques. For example, the pellicle frame 234 may be machined and may be machined from a single piece of frame material.

In an embodiment, the pellicle frame 234 may be coated with a chemically inert coating prior to bonding to the pellicle 231. In this way, outgassing of the pellicle frame 234 may be reduced or eliminated.

In an embodiment, the entire pellicle frame 234 may be coated with a chemical coating that is resistant to the etching used to etch the substrate 232. The entire pellicle assembly 230 may then be constructed and cleaned before etching the substrate 232, thereby increasing yield.

In the above example described with reference to FIGS. 23 and 24, it is described that the frame 234 may comprise silicon. In other embodiments, however, the frame may comprise a material that is not silicon. For example, the frame 234 may comprise at least one of aluminum, titanium, beryllium, aluminum nitride, Zerodur® ceramic material, silicon oxide and silicon carbide. The choice of frame material may be selected depending on the bonding temperature and a desired pellicle pre-stress.

Figure 25:
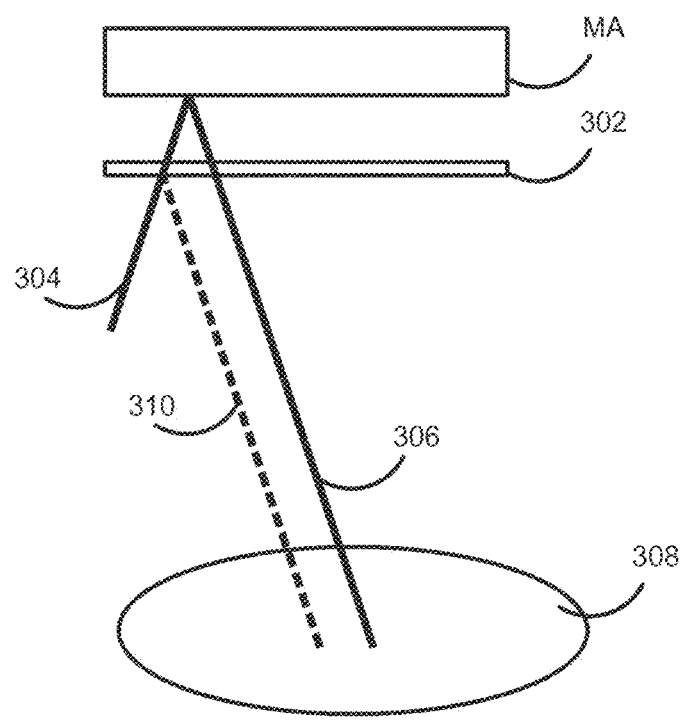
FIG. 25 schematically depicts reflection of radiation from a pellicle towards a substrate.

In an embodiment, a pre-stress of a pellicle may be selected so that the pellicle wrinkle in a particular manner (e.g. having wrinkles of a particular desired dimension) in order to improve performance of the lithographic apparatus. With reference to FIG. 25, there is shown a patterning device MA which is protected by a pellicle 302. A radiation beam 304 passes through the pellicle 302 and is incident on the patterning device MA. A patterned radiation beam 306 reflects from the patterning device MA, passes through the pellicle 302 and is incident at a desired area of a substrate 308. The pellicle 302, however, is not completely transparent to the radiation beam 304. A portion of the radiation beam 304 is absorbed by the pellicle 302 while a portion 310 is reflected from the pellicle 302. The reflected portion 310 may be, for example, of the order of 0.4% of the radiation beam 304. The reflected portion 310 does not follow the same path as the patterned radiation beam 306 and is therefore not incident on the desired area of the substrate 308. Further, as the reflected portion 310 never interacts with the patterning device MA, the reflected portion 310 is not patterned with the desired pattern. As such, the reflected beam 306 can cause an overlay errors and/or reduced contrast.

Figure 26:
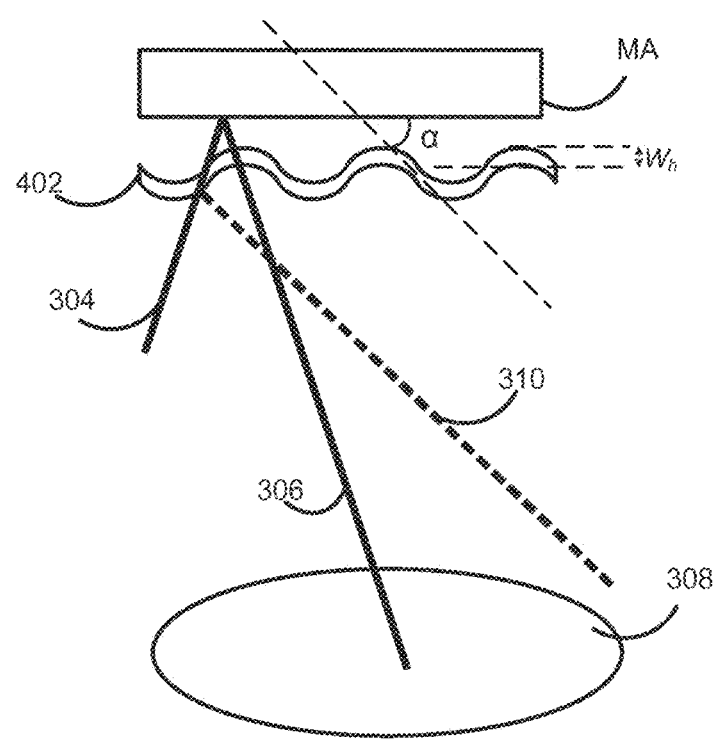
FIG. 26 schematically depicts reflection of radiation from a wrinkled pellicle away from a substrate.

In an embodiment, pellicle properties are selected so as to cause the development of wrinkles which reflect at least a portion of the incident radiation beam along a path of propagation that does not intersect the substrate. FIG. 26 shows an arrangement similar to that shown in FIG. 25 with like components provided with like reference numerals. In FIG. 26, however, a pellicle 402 is configured to wrinkle in such a way so as to cause the reflected portion 310 to follow a path which does not intersect the substrate 308. As such, in the embodiment of FIG. 26, the portion 310 does not result in reduced contrast or overlay errors. It will be appreciated that it may not be possible to prevent all reflections from the pellicle 402 onto the substrate (e.g. portions reflected from peaks of troughs of wrinkles), but that by selecting for appropriate wrinkles, an amount of radiation which is reflected from the pellicle onto the substrate may be reduced.

The quality of the wrinkling of the pellicle 402 may be controlled using any of the techniques described herein to control the pre-stress present within the pellicle 402. Additionally, the temperature of the pellicle 402 may also be controlled. In an embodiment, the pre-stress and temperature of the pellicle 402 is selected so as to cause wrinkles with an angle α of greater than approximately 35 mrad to a plane defined by the surface of the pellicle at room temperature. It will be appreciated, however, that the desired angle of the wrinkle may vary in dependence upon an optical path length between the patterning device and the substrate.

In an embodiment, the pellicle 402 is subjected to a pre-stress of approximately 240 MPa. In an embodiment, the pellicle 402 may be heated to an operational temperature (e.g. during a patterning operation) of between approximately 200-450 degrees C. In an exemplary embodiment in which the pellicle 402 comprises a pre-stress of approximately 240 MPa and is heated to approximately 450 degrees C., the pellicle 402 may exhibit wrinkles having a maximum local angle α of up to approximately 40 mrad and a wrinkle height Wh of the order of 10 μm. Generally, however, it will be appreciated that the wrinkle height may differ and that the wrinkle height may depend upon a material composition of the pellicle. In an embodiment in which the wavelength of the radiation beam 304 is of the order of 13.5 nm, the pellicle may be configured to exhibit wrinkles with a minimum height of the order of 10 μm. While it may generally have been expected that wrinkles in the pellicle 402 may increase absorption of the incident radiation beam 304, it has been determined that any increase in absorption of the radiation beam 304 due to wrinkles having local angels of less than approximately 300 mrad may be acceptable.

Pellicles may have a finite time in which they are effective and/or during which the likelihood of failure is within a desired threshold. For example, for some pellicles, it may be the case that after a certain use-time, the pellicles become sufficiently likely to fail that it is preferred to avoid their use. In the event of catastrophic failure of the pellicle, the elastic energy stored within the pellicle may result in breakage of the pellicle which in turn may result in pieces of the pellicle being emitted into other areas of the lithographic apparatus, thereby resulting in downtime of the lithographic apparatus.

In order to allow for a determination to be made as to whether a pellicle should be used, an embodiment provides a wirelessly readable and writeable tracking device within the pellicle frame of a pellicle. For example, the pellicle frame may include a near-field communication (NFC) chip (such as an RFID "tag"). For example, the tracking device may be installed into the pellicle frame during manufacture or mounting onto a patterning device. The tracking device provided with a serial number which uniquely identifies the pellicle and/or the pellicle assembly. The tracking device may further store operational data which may be used to track the operational history of the pellicle. For example, the operational data may include a number of exposures to which the pellicle has been exposed, a time of manufacture, a total amount of radiation (e.g., based upon a number of exposures and a known power of each exposure) and/or any other information which may be used to determine whether a pellicle has reached an end of its useful lifetime. The tracking device may also store pellicle specific information, for example a list of parameter values measured offline (e.g. EUV transmission, reflection, etc.).

When the pellicle/patterning device combination is loaded into the lithographic apparatus, a transceiver arrangement (comprising, for example, a single transceiver or a separate receiver and transmitter) provided within the lithographic apparatus may be caused (i.e., by a controller) to read the serial number of the pellicle and the operational data. The controller may determine whether one or more particular ones of the operational data items exceeds a threshold. For example, the controller may determine whether the number of exposures to which the pellicle has been exposed, or a time since manufacture, exceeds a threshold. If the controller determines that one or more of the operational data items exceeds a threshold, the lithographic apparatus may unload the pellicle/patterning device combination. The controller may further cause the transceiver to write data to the tracking chip to mark the pellicle as unusable or to indicate that it has been refused for use by the particular lithographic apparatus.

If it is determined that the particular operational data items do not exceed their relevant thresholds, the controller tracks the usage of the pellicle during operation. For example, the controller may record the number of exposures to which the pellicle is exposed and may cause the transceiver to write that data to the tracking device. The tracking data may be written to the tracking device during use or during an unloading operation in which the pellicle/patterning device are removed from the lithographic apparatus.

Upon removal from a lithographic apparatus, the tracking device within a pellicle/patterning device combination may be read to determine whether the pellicle has been marked as unusable, or whether one or more of the operational data items exceed a threshold. It may then be determined whether to replace the pellicle for the patterning device.

Figure 27A:
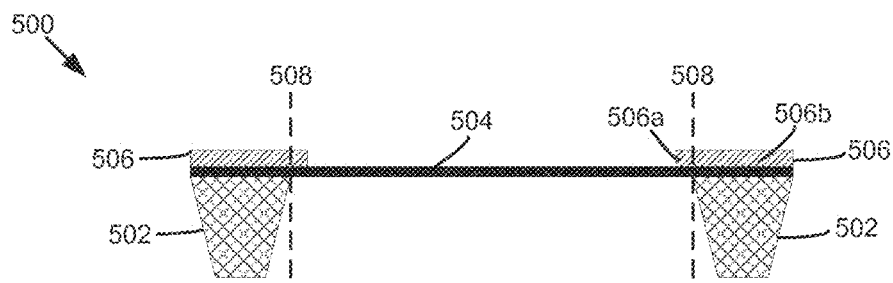
FIGS. 27a-27c schematically depict example arrangements of a pellicle assembly strengthened by application of at least one tensile layer.
Figure 27B:
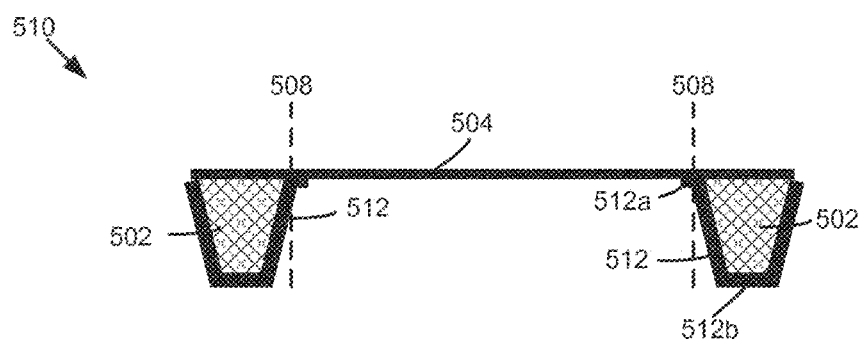
Figure 27C:
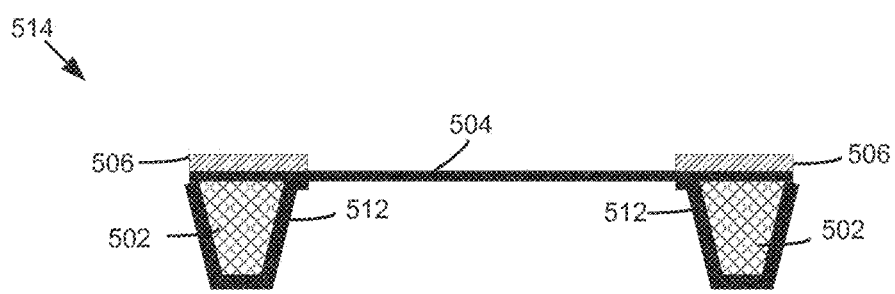

FIGS. 27a-27c schematically depict other arrangements by which a pellicle assembly may be strengthened to prevent breakage during use or manufacture. Referring to FIG. 27a, a pellicle assembly 500 comprises a pellicle frame 502 supporting a pellicle 504. The pellicle frame 502 may, for example, be manufactured as described above. A tensile layer 506 is applied to a "front" or "top" side of the pellicle arrangement 500 (i.e. such that the pellicle 504 is disposed between the tensile layer 506 and the pellicle frame 502). It will be appreciated that the tensile layer 506 may be provide onto the pellicle 504 in any appropriate manner (such as by any form of deposition or by growing the tensile layer 506 on the pellicle 504).

Viewed in cross-section as depicted in FIG. 27a, the tensile layer 506 extends laterally inward beyond (e.g. overlaps or bridges) the inward edge 508 of the pellicle frame 502. The location of the inward edge 508 of the pellicle frame is normally a weak point in the pellicle assembly and a location at which pellicle assemblies are often subject to mechanical failure. The presence of the tensile layer 506, extending over the weak point at the edge 508, acts to maintain tension in the pellicle 504 and strengthen the pellicle assembly 500. In this way the tensile layer 506 allows for the pellicle 504 to be subject to additional pretension than would be possible without the presence of the tensile layer 506. As discussed in detail above, applying appropriate and sufficient levels of pretension to the pellicle 504 improves the optical properties of the pellicle assembly by preventing wrinkling. The tensile layer 508 preferably extends inwardly only over a non-optically active portion of the pellicle 504. That is, the tensile layer 508 preferable does not extend inwardly to an extent at which it would overlap a beam path of the radiation beam B. As in the arrangement depicted in FIG. 27a, it is preferable (but not essential) for the tensile layer 508 to have an outward extent from the edge 508 greater than the inward extent from the edge 508 to provide greater strength. In this way, as depicted in FIG. 27a, the tensile layer 506 comprises a first portion 506a which extends inwardly from the edge 508 and a second, larger, portion 506b which extends outwardly from the edge 508.

As shown with reference to the pellicle assembly 510 in FIG. 27b, a tensile layer 512 may instead be applied to a "bottom" or "underside" of the pellicle 504. As with the tensile layer 506 in the pellicle assembly 500, the tensile layer 512 of the pellicle assembly 510 extends across the inner boundary between the pellicle frame 502 and the pellicle 504, thereby strengthening the pellicle assembly 510. In the arrangement of FIG. 27b, a first portion 512a of the tensile layer 506 extends inwardly from the edge 508, and a second, larger, portion 512b extends outwardly from the edge 508. Additionally, in the arrangement 510, the second portion 512b extends over a plurality of faces of the pellicle from 502. In particular, in the example of FIG. 27a, the second portion 512b extends over all exposed faces of the pellicle frame 504 (e.g. all faces other than the "top" face to which the pellicle 504 is applied). In this way, the tensile layer 512 is particularly able strengthen the pellicle assembly 510 and allow for greater pretension of the pellicle 504.

Further, as depicted in FIG. 27c, a pellicle assembly 514 may comprise both the tensile layer 506 and the tensile layer 512. The tensile layer may comprise any suitable material. For example, the tensile layer may comprise molybdenum (Mo), ruthenium (Ru), well adhering metal layers, such as aluminum (Al), titanium (Ti), tantalum (Ta), vanadium (V), chromium (Cr), niobium (Nb), hafnium (Hf), tungsten (W), etc., oxides such as TiO2, Ta2O5, etc. nitrides such as TiN, TaN, CrN, SiN or carbides such as TiC, TaC, SiC, etc. Generally, any material that adheres sufficiently and may be deposited with sufficient tensile stress (as determined by the particular requirements of the particular application) may be used. Further, the tensile layers may comprise a multilayer structure, with each layer comprising a different material. For example, the tensile layer may comprise a capping, protective layer atop a tension providing layer. By way of example only, a tensile layer may comprise a first layer of molybdenum to provide a tension and a second layer of ZrO2 to act as a protective layer. Additionally, tensile layers provided on the front (such as the tensile layer 506) may have a different structure and composition to tensile layers provided on the back (such as the tensile layer 512). This beneficially allows for different materials to be used to match different operating conditions "above" and "below" the pellicle 504. It will further be appreciated that thicknesses of the tensile layer and distances by which the tensile layers extend either side of the edge 508 may be selected in dependence upon the particular materials used.

Generally, the above-described arrangements provide pellicle assemblies for which the stress under non-operating conditions (e.g., pre-stress) may be selected in dependence upon application requirements. Where, for example, it is desired to provide a lower pre-tension than currently achievable, the lifetime of a pellicle may be improved while allowing for a desired thermo-chemical nature. That is, the above techniques allow for a separation of the thermo-chemical nature of the pellicle and the pre-stress present in the pellicle after manufacture of the pellicle assembly. Further, in the event of catastrophic failure of the pellicle, the reduced tension that may be achieved through the above disclosed arrangements is that there is less elastic energy stored within the pellicle. As such, there is a lower likelihood that breakage of the pellicle will result in pieces of the pellicle would be emitted into other areas of the lithographic apparatus, thereby reducing downtime of the lithographic apparatus. Further, while the above described arrangements are described with respect to pellicles that are used to protect a patterning device MA, it is to be understood that the above pellicle assemblies described herein may be used in other applications, both for lithography and more broadly. For example, the above described arrangements may be used to provide pellicle assemblies for use in dynamic gas locks.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyze the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although it is described above that the source SO may be a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below.

1. A pellicle assembly, the pellicle assembly comprising a pellicle frame defining a surface onto which a pellicle is attached;
wherein the pellicle assembly comprises one or more three-dimensional expansion structures that allow the pellicle to expand under stress.
2. The pellicle assembly of clause 1, wherein at least one of the three-dimensional expansion structures is formed within the pellicle frame and thereby imparted to the pellicle.
3. The pellicle assembly of clause 1 or 2, wherein at least one of the three-dimensional expansion structures forms a spring.
4. The pellicle assembly of clause 3, wherein the spring comprises at least one V-shaped formation formed within the pellicle frame.
5. The pellicle assembly of any preceding clause, wherein the at least one structure comprises a plurality of springs formed within the pellicle frame and positioned around a central portion of the pellicle.
6. The pellicle assembly of clause 2 or any clause dependent thereon, wherein the at least one spring is a leaf-spring.
7. The pellicle assembly of any preceding clause, wherein at least one of the three-dimensional expansion structures is present on a central portion of the pellicle.
8. The pellicle assembly of clause 7, wherein the frame comprises a substrate and the pellicle assembly comprises at least one spring layer between the substrate and the pellicle, wherein at least one spring is formed within the spring layer.
9. The pellicle assembly of any preceding clause, wherein the at least one three-dimensional expansion structure comprises a herringbone pattern.
10. The pellicle assembly of clause 9, wherein the at least one three-dimensional expansion structure comprises a herringbone pattern that extends across a majority of a total surface of the pellicle.
11. The pellicle assembly of any preceding clause, wherein the at least one three-dimensional expansion structure results in roughness across a surface of the pellicle.
12. A pellicle assembly, the pellicle assembly comprising a pellicle frame defining a surface onto which a pellicle is attached;
wherein the surface comprises at least one adhesive boundary for reducing adhesive spread.
13. The pellicle assembly of clause 12, wherein the at least one adhesive boundary comprises a circular boundary.
14. The pellicle assembly of clause 12 or 13, wherein the at least one adhesive boundary comprises a line boundary.
15. The pellicle assembly of clause 14, wherein the line boundary is positioned adjacent to an edge of the frame, the edge of the frame adjacent to a central portion of the pellicle.
16. The pellicle assembly of clause 14 or 15 as dependent on clause 13, wherein the line boundary is positioned between the circular boundary and a central portion of the pellicle.
17. The pellicle assembly of any one of clauses 12 to 16, wherein the at least one boundary comprises a groove within the frame.
18. The pellicle assembly of any one of clauses 12 to 17, wherein the pellicle assembly comprises adhesive that is substantially concentric with the circular boundary.
19. A pellicle assembly comprising:
a pellicle frame;
a pellicle;
one or more actuators for moving the pellicle assembly towards and way from a patterning device.
20. The pellicle assembly of clause 19, wherein the actuators are configured to transition the pellicle assembly between a closed configuration in which a substantially sealed volume is formed between the pellicle and a patterning device and an open configuration in which a volume between the pellicle and the patterning device is in fluid communication with an ambient environment.
21. A pellicle assembly comprising:
a pellicle frame defining a surface onto which the pellicle is attached;
wherein the pellicle frame comprises a first material having a first coefficient of thermal expansion and a second material having a second coefficient of thermal expansion.

22. The pellicle assembly of clause 21, wherein the first material comprises silicon.
23. The pellicle assembly of clause 21 or 22, wherein the first material comprises a plurality of perforations and the second material is located within the plurality of perforations.
24. The pellicle assembly of clause 21, 22 or 23, wherein the second material at least partially surrounds the first material.
25. The pellicle assembly of any one of clauses 21 to 24, wherein the second material comprises a metal.
26. A pellicle assembly comprising:
a pellicle frame defining a surface onto which the pellicle is attached;
wherein the pellicle frame is bonded to the pellicle.
27. The pellicle frame of clause 26, wherein the pellicle is an annealed pellicle and the pellicle frame was bonded to the pellicle after annealing.
28. The pellicle assembly of clause 26 or 27, wherein the pellicle frame comprises a material having a coefficient of thermal expansion (CTE) which is lower than the CTE of silicon.
29. The pellicle assembly of clause 26, 27 or 28, wherein the pellicle frame comprises a glass-ceramic material.
30. The pellicle assembly of any of clauses 26 to 29, wherein the pellicle frame has been bonded to the pellicle using a bonding procedure operating at a temperature of less than approximately 160 degrees Celsius.
31. The pellicle assembly of any of clauses 26 to 30, wherein the pellicle frame has been bonded to the pellicle using at least one of optical contact bonding, hydrogen bonding, gold diffusion bonding or anodic bonding.
32. The pellicle assembly of any of clauses 26 to 31, wherein the pellicle frame is formed in a single piece.
33. The pellicle assembly of any of clauses 26 to 32, wherein the pellicle frame comprises an inert coating to reduce outgassing.
34. The pellicle assembly of any of clauses 26 to 33, wherein the pellicle frame does not comprise silicon.
35. The pellicle assembly of any one of clauses 26 to 34, wherein the pellicle frame comprises at least one of aluminum, titanium, beryllium, aluminum nitride, Zerodur® ceramic material, silicon oxide and silicon carbide.
36. A pellicle assembly, the pellicle assembly comprising a pellicle frame defining a surface onto which a pellicle is attached;
wherein when irradiated with a radiation beam for patterning a substrate to be patterned the pellicle comprises one or more wrinkles and is partially reflective of the radiation beam; and
wherein the one or more wrinkles are configured to reflect a portion of the radiation beam away from the substrate to be patterned.
37. The pellicle assembly of clause 36, wherein the pellicle is configured such that the wrinkles create a maximum angle of greater than 35 mrad to a plane defined by the surface of the patterning device.
38. The pellicle assembly of clause 36 or 37, wherein the pellicle is configured such that the wrinkles create a maximum angle of less than 300 mrad to a plane defined by the surface of the patterning device.
39. The pellicle assembly of clause 36, 37 or 38, wherein the pellicle is configured to reflect approximately 0.4% of an incident radiation beam during use.
40. The pellicle assembly of any preceding clause, wherein the pellicle comprises molybdenum disilicide ($MoSi_2$) and wherein an average stress within the pellicle is in a range of from 100 MPa to 250 MPa at room temperature.
41. The pellicle assembly of any preceding clause, wherein the pellicle comprises a graphite-based material and wherein an average stress within the pellicle is in a range of from 300 MPa to 450 MPa at room temperature.
42. A lithographic apparatus arranged to project a pattern from a patterning device onto a substrate, comprising a pellicle assembly according to any preceding clause positioned in the vicinity of the patterning device to prevent particles from contacting the patterning device.
43. A method of manufacturing a pellicle assembly comprising:
depositing a pellicle onto a substrate;
bonding a pellicle frame to the pellicle such that the pellicle is between the pellicle frame and the substrate;
etching the substrate to leave the pellicle and the pellicle frame.
44. The method of clause 43, wherein the pellicle frame is bonded to the pellicle at a temperature below 160 degrees Celsius.
45. The method of clause 43 or 44, further comprising annealing the pellicle after depositing the pellicle onto the substrate and before bonding the pellicle frame to the pellicle.
46. A pellicle assembly, comprising:
a pellicle frame defining a surface onto which a pellicle is attached;
wherein a computer readable and writeable tracking device is provided on or in the pellicle frame.
47. The pellicle assembly of clause 46, wherein the computer readable and writable tracking device is configured to store an identifier of the pellicle and/or the pellicle assembly.
48. The pellicle assembly of clause 46 or 47, wherein the computer tracking device is configured to store operational data indicating usage history of the pellicle and/or pellicle specific properties.
49. A lithographic apparatus arranged to project a pattern from a patterning device onto a substrate, comprising a controller comprising a processor configured to execute computer readable instructions to cause a transceiver arrangement to read from and write to a tracking device of a pellicle assembly according to any one of clauses 46 to 48.
50. The lithographic apparatus of clause 49, wherein the computer readable instructions are configured to cause the processor to obtain one or more operational data items from the tracking device and to determine whether the one or more operational data items exceed a threshold.
51. The lithographic apparatus of clause 50, wherein the computer readable instructions are configured to cause the processor, in response to determining that the one or more operational data items exceed a threshold, to cause the lithographic apparatus to unload the pellicle assembly.
52. The lithographic apparatus of clause 51, wherein the computer readable instructions are configured to cause the processor to cause the transceiver arrangement to write to the tracking device data indicating that the pellicle assembly has been unloaded.

53. The lithographic apparatus of clause 50 or 52, wherein the computer readable instructions are configured to cause the processor, in response to determining that the one or more operational data items do not exceed the threshold, to cause the transceiver to record operational data on the tracking device during use of the lithographic apparatus.

54. A pellicle assembly, comprising:
a pellicle frame defining a surface onto which a pellicle is attached; and
one or more tensile layers in mechanical communication with the pellicle and extending inwardly beyond an inner edge of the pellicle frame.

55. The pellicle assembly of clause 54, wherein at least one of the one or more tensile layers is provided on a top side of the pellicle such that the pellicle is positioned between the tensile layer and the frame.

56. The pellicle assembly of clause 54 or 55, wherein at least one of the one or more tensile layers is provided on an underside of the pellicle.

57. The pellicle assembly of clause 54, 55 or 56, wherein the one or more tensile layers comprises a first tensile layer provided on a top side of the pellicle and a second tensile layer provided on an underside of the pellicle.

58. The pellicle assembly of any one of clauses 54 to 57, wherein at least one of the one or more tensile layers comprises a first portion extending inwardly from the inner edge of the pellicle frame and a second portion extending outwardly from the inner edge of the pellicle frame, wherein the second portion is longer than the first portion.

59. The pellicle assembly of any one of clauses 54 to 57, wherein at least one of the one or more tensile layers comprises a multi-layer structure.

60. A lithographic apparatus arranged to project a pattern from a patterning device onto a substrate, comprising a pellicle assembly according to any of clauses 54 to 59 positioned in the vicinity of the patterning device to prevent particles from contacting the patterning device.

61. A dynamic gas lock for a lithographic apparatus, comprising a pellicle assembly according to any one of clauses 1 to 41, 46 to 48 or 54 to 59.

The invention claimed is:

1. A pellicle assembly comprising:
a pellicle frame defining a surface onto which a pellicle is, or to be, attached, the pellicle frame comprising a first material having a first coefficient of thermal expansion and a second material having a second different coefficient of thermal expansion.

2. The pellicle assembly of claim 1, wherein the first material comprises silicon.

3. The pellicle assembly of claim 1, wherein the first material comprises a plurality of perforations and the second material is located within the plurality of perforations.

4. The pellicle assembly of claim 1, wherein the second material at least partially surrounds the first material.

5. The pellicle assembly of claim 1, wherein the second material comprises a metal.

6. The pellicle assembly of claim 1, wherein the pellicle frame comprises a material having a coefficient of thermal expansion (CTE) which is lower than the CTE of silicon.

7. The pellicle assembly of claim 1, wherein the pellicle frame comprises a glass-ceramic material.

8. The pellicle assembly of claim 1, wherein the pellicle frame is formed in a single piece.

9. The pellicle assembly of claim 1, wherein the pellicle frame comprises an inert coating to reduce outgassing.

10. The pellicle assembly of claim 1, wherein the pellicle frame comprises at least one selected from: aluminum, titanium, beryllium, aluminum nitride, lithium-aluminosilicate glass-ceramic, silicon oxide and/or silicon carbide.

11. The pellicle assembly of claim 1, comprising the pellicle and wherein the pellicle comprises molybdenum disilicide and wherein an average stress within the pellicle is in a range of from 100 MPa to 250 MPa at room temperature.

12. The pellicle assembly of claim 1, comprising the pellicle and wherein the pellicle comprises a graphite-based material and wherein an average stress within the pellicle is in a range of from 300 MPa to 450 MPa at room temperature.

13. A pellicle assembly, comprising:
a pellicle frame defining a surface onto which a pellicle is, or to be, attached, wherein a computer readable and writable tracking device is provided on or in the pellicle frame.

14. The pellicle assembly of claim 13, wherein the computer readable and writable tracking device is configured to store an identifier of the pellicle and/or the pellicle assembly.

15. The pellicle assembly of claim 13, wherein the computer readable and writable tracking device is configured to store operational data indicating usage history of the pellicle and/or indicating pellicle specific properties.

16. A pellicle assembly, comprising:
a pellicle frame defining a surface onto which a pellicle is attached; and
one or more tensile layers in mechanical communication with the pellicle and extending inwardly beyond an inner edge of the pellicle frame.

17. The pellicle assembly of claim 16, wherein at least one of the one or more tensile layers is provided on a top side of the pellicle such that the pellicle is positioned between the tensile layer and the frame.

18. The pellicle assembly of claim 16, wherein at least one of the one or more tensile layers is provided on an underside of the pellicle.

19. The pellicle assembly of claim 16, wherein at least one of the one or more tensile layers comprises a first portion extending inwardly from the inner edge of the pellicle frame and a second portion extending outwardly from the inner edge of the pellicle frame, wherein the second portion is longer than the first portion.

20. The pellicle assembly of claim 16, wherein at least one of the one or more tensile layers comprises a multi-layer structure.

* * * * *